United States Patent
Ota et al.

(10) Patent No.: US 8,614,601 B2
(45) Date of Patent: Dec. 24, 2013

(54) POWER AMPLIFIER AND OPERATING METHOD THEREOF

(71) Applicant: Murata Manufacturing Co., Ltd., Nagaokakyo (JP)

(72) Inventors: Ikuma Ota, Nagaokakyo (JP); Hiroaki Inose, Nagaokakyo (JP); Shun Imai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/908,135

(22) Filed: Jun. 3, 2013

(65) Prior Publication Data

US 2013/0265111 A1    Oct. 10, 2013

Related U.S. Application Data

(63) Continuation of application No. PCT/JP2012/062419, filed on May 15, 2012.

(30) Foreign Application Priority Data

May 18, 2011    (JP) .................................. 2011-111296

(51) Int. Cl.
    *H03F 1/14*    (2006.01)
(52) U.S. Cl.
    USPC .......................... 330/51; 330/124 R; 330/302
(58) Field of Classification Search
    USPC ................... 330/51, 124 R, 295, 302, 84, 126
    See application file for complete search history.

(56) References Cited

U.S. PATENT DOCUMENTS

| 5,548,246 | A | 8/1996 | Yamamoto et al. |
| 7,157,966 | B2 | 1/2007 | Baree et al. |
| 7,589,589 | B2 * | 9/2009 | Kusunoki ........................ 330/51 |
| 7,863,979 | B2 * | 1/2011 | Chung et al. .............. 330/124 R |
| 7,944,291 | B2 * | 5/2011 | Jung et al. ........................ 330/51 |
| 8,421,539 | B2 * | 4/2013 | Zhang et al. .................. 330/295 |

(Continued)

FOREIGN PATENT DOCUMENTS

| JP | 07-336168 A | 12/1995 |
| JP | 2001-185962 A | 7/2001 |

(Continued)

OTHER PUBLICATIONS

Official Communication issued in International Patent Application No. PCT/JP2012/062419, mailed on Aug. 14, 2012.

*Primary Examiner* — Henry Choe
(74) *Attorney, Agent, or Firm* — Keating & Bennett, LLP

(57) ABSTRACT

A power amplifier includes a first amplifier and a second amplifier which include large and small size elements. An RF input signal is amplified by the first and second amplifiers. An output of the first amplifier is connected to an input of a first output matching circuit. An output of the second amplifier is connected to an input of a second output matching circuit. An output of the second output matching circuit is connected to an RF signal output terminal. In a high power state, the RF input signal is amplified by the first amplifier. In a low power state, the RF input signal is amplified by the second amplifier. In amplification with low power and high frequency, reactances of the second output matching circuit are set at predetermined values. In amplification with low power and low frequency, the reactances of the second output matching circuit are set at larger values.

20 Claims, 14 Drawing Sheets

(56) References Cited

U.S. PATENT DOCUMENTS

| | | |
|---|---|---|
| 2001/0029168 A1 | 10/2001 | Yamaguchi |
| 2003/0025555 A1 | 2/2003 | Ohnishi et al. |
| 2007/0298736 A1 | 12/2007 | Fujioka et al. |
| 2011/0037516 A1* | 2/2011 | Nejati et al. ............ 330/124 R |

FOREIGN PATENT DOCUMENTS

| | | |
|---|---|---|
| JP | 2001-292033 A | 10/2001 |
| JP | 2003-046340 A | 2/2003 |
| JP | 2008-035487 A | 2/2008 |

* cited by examiner

| Band | | Power Mode | ENA | MODE | BS1 | BS2 | BS3 |
|---|---|---|---|---|---|---|---|
| Low Band | Band 5 | High Power | H | H | L | H | L |
| | Band 8 | | | | | L | |
| | Band 5 | Low Power | | L | | H | |
| | Band 8 | | | | | L | |
| High Band | Band 1 | High Power | | H | H | L | L |
| | Band 2 | | | | | H | |
| | Band 4 | | | | | | H |
| | Band 1 | Low Power | | L | | L | L |
| | Band 2 | | | | | H | |
| | Band 4 | | | | | | H |

FIG. 21

| Mode | Band | | Power Mode | ENA | BS (BS1) | GMODE (BS2) | VRAMP (BS3) | WMODE1 | WMODE2 |
|---|---|---|---|---|---|---|---|---|---|
| GMSK | Low Band | | — | --- | L | H | For Ramping | L | L |
|  | High Band | |  |  | H |  |  |  |  |
| EDGE | Low Band | |  |  | L | L | ∗ | L | L |
|  | High Band | |  |  | H |  |  |  |  |
| WCDMA | Low Band | Band 5 | High Power | H | L | H | L | H | L |
|  |  | Band 8 |  |  |  | L |  |  |  |
|  |  | Band 5 | Medium Power |  |  | H |  | L | H |
|  |  | Band 8 |  |  |  | L |  |  |  |
|  |  | Band 5 | Low Power |  |  | H |  | H |  |
|  |  | Band 8 |  |  |  | L |  |  |  |
|  | High Band | Band 1 | High Power |  |  | L | L | H | L |
|  |  | Band 2 |  |  |  | H |  |  |  |
|  |  | Band 4 |  |  |  | H | H |  |  |
|  |  | Band 1 | Medium Power |  |  | L | L | L | H |
|  |  | Band 2 |  |  |  | H |  |  |  |
|  |  | Band 4 |  |  |  | H | H |  |  |
|  |  | Band 1 | Low Power |  |  | L | L | H |  |
|  |  | Band 2 |  |  |  | H |  |  |  |
|  |  | Band 4 |  |  |  | H | H |  |  |

POWER AMPLIFIER AND OPERATING METHOD THEREOF

BACKGROUND OF THE INVENTION

1. Field of the Invention

The present invention relates to a power amplifier and an operating method of the power amplifier, and more particularly relates to a technique that is effective to enable power amplification in a wide range from a low power state to a high power state and to increase power added efficiency when power of RF input signals having transmit frequencies in a plurality of frequency bands is amplified.

2. Description of the Related Art

A mobile communication device terminal that is operated by a battery, such as a cellular phone, must increase the power efficiency of a power amplifier that transmits an RF transmit signal to a base station. Additionally, the power consumption of the power amplifier has to be reduced to provide as long a talk time as possible through a single charge of the battery.

Japanese Unexamined Patent Application Publication No. 2008-035487 describes that a first amplifying element with a small element size and a second amplifying element with a large element size are connected in parallel, power amplification is executed by the first amplifying element in a low power state, and power amplification is executed by the second amplifying element in a high power state. The first amplifying element with the small element size exhibits high power added efficiency (PAE) in the low power state, and the second amplifying element with the large element size exhibits high power added efficiency (PAE) in the high power state. Hence, the power added efficiency of the power amplifier can be increased for transmission of power in a wide range from the low power state to the high power state. The U.S. patent publication corresponding to Japanese Unexamined Patent Application Publication No. 2008-035487 is U.S. Patent Application Publication No. 2007/0298736 A1.

U.S. Pat. No. 7,157,966 describes that a first output stage with the element size of an output transistor being optimized for high power and a second output stage with the element size of an output transistor being optimized for low power are connected in parallel, and a bias control circuit selects the first output stage in the high power and selects the second output stage in the low power. The first output stage and the second output stage are connected to a single output impedance matching circuit. The single output impedance matching circuit includes a plurality of capacitances and a plurality of inductors.

The inventors of the present invention participated in development to provide a power amplifier that could be mounted on a cellular phone of the third generation (3G) or the fourth generation (4G) and could perform transmission in a plurality of frequency bands. Further, this power amplifier had to have high power added efficiency (PAE) to provide a long talk time.

FIG. 23 illustrates a configuration of a power amplifier PA studied by the inventors of the present invention prior to development of the present invention.

The power amplifier PA shown in FIG. 23 and studied by the inventors of the present invention prior to development of the present invention includes a first amplifier 1 with a large element size, a second amplifier 2 with a small element size, a first output matching circuit 3, and a second output matching circuit 4.

The first amplifier 1 functions as a main amplifier including a transistor with a large element size to exhibit high power added efficiency (PAE) in a high power state, and the second amplifier 2 functions as a sub amplifier including a transistor with a small element size to exhibit high power added efficiency (PAE) in a low power state.

If the first amplifier 1 is operated, a first amplifier enable signal is supplied to a first control terminal 201. If the second amplifier 2 is operated, a second amplifier enable signal is supplied to a second control terminal 202.

An input terminal of the first amplifier 1 and an input terminal of the second amplifier 2 are commonly connected to an RF signal input terminal 101 of the power amplifier PA. AN RF input signal that is supplied to the RF signal input terminal 101 is amplified by the first amplifier 1 or the second amplifier 2.

A ground terminal of the first amplifier 1 and a ground terminal of the second amplifier 2 are commonly connected to a ground terminal of the power amplifier PA. A ground electrode of the power amplifier PA is electrically connected to ground wiring of a mother board of a cellular phone with a very small wiring resistance. Hence, the first amplifier 1 and the second amplifier 2 execute a markedly stable RF amplification operation. Further, the ground terminal of the power amplifier PA is mechanically connected to the ground wiring of the mother board of the cellular phone with a very small thermal resistance. Hence, Joule heat that is generated from the first amplifier 1 and the second amplifier 2 can be effectively radiated from the mother board of the cellular phone.

An output terminal of the first amplifier 1 is connected to an input terminal of the first output matching circuit 3, and an output terminal of the second amplifier 2 is connected to an input terminal of the second output matching circuit 4. An output terminal of the second output matching circuit 4 is connected to the input terminal of the first output matching circuit 3, and an output terminal of the first output matching circuit 3 is connected to an output terminal 102 of the power amplifier PA.

In the first amplifier 1, an input electrode and a ground electrode of a transistor Q1 with a large element size are respectively connected to the input terminal and the ground terminal of the first amplifier 1. An output electrode of the transistor Q1 with the large element size is connected to a power terminal 205 of the power amplifier PA through a first load. The output electrode of the transistor Q1 with the large element size is connected to the output terminal of the first amplifier 1.

In the second amplifier 2, an input electrode and a ground electrode of a transistor Q2 with a small element size are respectively connected to the input terminal and the ground terminal of the second amplifier 2. An output electrode of the transistor Q2 with the small element size is connected to a power terminal 205 of the power amplifier PA through a second load. The output electrode of the transistor Q2 with the small element size is connected to the output terminal of the second amplifier 2.

The first amplifier 1 has a relatively small output impedance because of the transistor Q1 having the large element size of the first amplifier 1. In contrast, the second amplifier 2 has a relatively large output impedance because of the transistor Q2 having the small element size of the second amplifier 2. For example, the output impedance of the first amplifier 1 is several ohms, and the output impedance of the second amplifier 2 is several tens of ohms.

The first output matching circuit 3, the input terminal of which is connected to the output terminal of the first amplifier 1, executes matching between the output impedance of several ohms of the first amplifier 1 and an impedance of a transmit antenna of 50Ω, which is connected to the output terminal 102 of the first output matching circuit 3. That is, an input impedance of the first output matching circuit 3 is set at several ohms, and hence the output impedance of the first amplifier 1 and the input impedance of the first output matching circuit 3 are matched. Consequently, reflection of the RF signal can be sufficiently reduced between the output of the first amplifier 1 and the input of the first output matching circuit 3. Further, an output impedance of the first output matching circuit 3 is set at 50Ω, and hence the output impedance of the first output matching circuit 3 and the input impedance of the transmit antenna of 50Ω are matched. Consequently, reflection of the RF signal can be sufficiently reduced between the output of the first output matching circuit 3 and the input of the transmit antenna. The first output matching circuit 3 can be provided by a plurality of inductors and a plurality of capacitances.

The second output matching circuit 4 executes matching between the output impedance of several tens of ohms of the second amplifier 2 and the input impedance of several ohms of the first output matching circuit 3. That is, an input impedance of the second output matching circuit 4 is set at several tens of ohms, and hence the output impedance of the second amplifier 2 and the input impedance of the second output matching circuit 4 are matched. Consequently, reflection of the RF signal can be sufficiently reduced between the output of the second amplifier 2 and the input of the second output matching circuit 4. Further, an output impedance of the second output matching circuit 4 is set at several ohms, and hence the output impedance of the second output matching circuit 4 and the input impedance of the first output matching circuit 3 are matched. Consequently, reflection of the RF signal can be sufficiently reduced between the output of the second output matching circuit 4 and the input of the first output matching circuit 3.

The second output matching circuit 4 of the power amplifier PA shown in FIG. 23 and studied by the inventors of the present invention prior to development of the present invention is provided by an inductor L1, a capacitance C1, and a first switch (SW1) 60. One end of the inductor L1 is connected to the output terminal of the first amplifier 1, the input terminal of the first output matching circuit 3, and the output terminal of the second output matching circuit 4. The other end of the inductor L1 is connected to the output terminal of the second amplifier 2 and the input terminal of the second output matching circuit 4. One end of the capacitance C1 is connected to the output terminal of the second amplifier 2 and the input terminal of the second output matching circuit 4. The other end of the capacitance C1 is connected to a ground potential GND.

If the second amplifier 2 is brought into a non-active state by the second amplifier enable signal that is supplied to the second control terminal 202, the first switch (SW1) 60 reduces an effect of the second output matching circuit 4 to the output terminal of the first amplifier 1. In the example shown in FIG. 23, the first switch (SW1) 60 is connected between the other end of the inductor L1 and the one end of the capacitance C1.

FIG. 24 illustrates a Smith chart explaining an operation of the second output matching circuit 4 of the power amplifier PA studied by the inventors of the present invention prior to the present invention shown in FIG. 23.

In FIG. 24, for easier understanding of the operation, it is assumed that an output impedance Zout_SA of the second amplifier 2 is a larger value than the actual several tens of ohms.

In FIG. 24, a relatively small output impedance Zout_MA of the first amplifier 1 and a relatively large output impedance Zout_SA of the second amplifier 2 are indicated on a line that connects a point at which a resistance value is zero (0) and a point at which the resistance value is infinity (∞). The relatively small output impedance Zout_MA of the first amplifier 1 is located at a slightly right side with respect to the point at which the resistance value is the zero (0). The relatively large output impedance Zout_SA of the second amplifier 2 is indicated at the right side of a point at which the resistance value is 50Ω; however, the output impedance Zout_SA is actually located between a point at which the resistance value is 25Ω and the point at which the resistance value is 50Ω.

Further, FIG. 24 indicates an input impedance Zin_MN of the first output matching circuit 3. The input impedance Zin_MN is matched to an impedance that is substantially equivalent to the relatively small output impedance Zout_MA of the first amplifier 1.

Hence, if the first amplifier 1 is controlled to be in a non-active state by the first amplifier enable signal that is supplied to the first control terminal 201, and if the second amplifier 2 is controlled to be in an active state by the second amplifier enable signal that is supplied to the second control terminal 202, the second output matching circuit 4 has to execute an impedance matching operation between the output impedance Zout_SA of the second amplifier 2 and the input impedance Zin_MN of the first output matching circuit 3 as follows.

That is, with the inductor L1 of the second output matching circuit 4, an impedance $Z_L$ at the other end of the inductor L1 departs from the input impedance Zin_MN of the first output matching circuit 3 and moves clockwise on an arc of a constant resistance circle. The moving amount at this time becomes ωL1 corresponding to an impedance jωL1 of the inductor L1. Herein, ω is an angular frequency.

Further, with the capacitance C1 of the second output matching circuit 4, the impedance at one end of the capacitance C1 departs from the impedance $Z_L$ at the other end of the inductor L1 and moves clockwise on an arc of a constant-conductance circle. The moving amount at this time becomes ωC1 corresponding to an admittance jωC1 of the capacitance C1.

Hence, the destination obtained by the sum total of the moving amount ωL1 of the inductor L1 and the moving amount ωC1 of the capacitance C1 has to be matched to the output impedance Zout_SA of the second amplifier 2. With this matching, the output impedance Zout_SA of the second amplifier 2 and the input impedance Zin_MN of the first output matching circuit 3 can be matched by the second output matching circuit 4 with almost no loss.

The power amplifier PA shown in FIG. 23 and studied by the inventors of the present invention prior to development of the present invention was designed to amplify an RF input signal RFIN having a transmit frequency in a single frequency band. Hence, the second output matching circuit 4 shown in FIG. 24 was designed to match the output impedance Zout_SA of the second amplifier 2 and the input impedance Zin_MN of the first output matching circuit 3 with the transmit frequency in the single frequency band.

However, since the power amplifier PA studied by the inventors of the present invention prior to development of the present invention shown in FIG. 23 was to be mounted on cellular phones of the third generation (3G) and the fourth generation (4G), RF input signals RFIN having transmit frequencies in a plurality of frequency bands had to be amplified by the power amplifier PA shown in FIG. 23.

A transmit frequency in a single frequency band was initially a high transmit frequency $f_{HB}$ among transmit frequencies in a plurality of frequency bands.

Hence, if the RF input signal RFIN having the high-band transmit frequency $f_{HB}$ is amplified by the power amplifier PA shown in FIG. 23, as shown in FIG. 24, by using the second output matching circuit 4 shown in FIG. 23, the destination obtained by the sum total of the moving amount ωL1 of the inductor L1 and the moving amount ωC1 of the capacitance C1 could be matched to the output impedance Zout_SA of the second amplifier 2.

In contrast, if the RF input signal RFIN having the low-band transmit frequency $f_{LB}$ is amplified by the power amplifier PA shown in FIG. 23, as shown in FIG. 24, even by using the second output matching circuit 4 shown in FIG. 23, the destination obtained by the sum total of the moving amount ωL1 of the inductor L1 and the moving amount ωC1 of the capacitance C1 could not be matched to the output impedance Zout_SA of the second amplifier 2. This is because the moving amount ωL1 of the inductor L1 and the moving amount ωC1 of the capacitance C1 are decreased with the low-band transmit frequency $f_{LB}$. As the result of the study by the inventors of the present invention prior to development of the present invention, a problem is recognized in which, with the mismatching between impedances, if the RF input signal applied to the input terminal 101 and having the low-band transmit frequency $f_{LB}$ is amplified by the power amplifier PA shown in FIG. 23, the power added efficiency (PAE) is decreased.

SUMMARY OF THE INVENTION

Preferred embodiments of the present invention enable power amplification in a wide range from a low power state to a high power state, and increase power added efficiency when power of RF input signals having transmit frequencies in a plurality of frequency bands is amplified.

The aforementioned benefits and new features of the preferred embodiments of the present invention will become apparent from the explanation in the description and the attached drawings.

Representative configurations of various preferred embodiments of the present invention disclosed in this application are briefly described below.

A power amplifier according to a representative preferred embodiment of the present invention includes an RF signal input terminal, a first amplifier, a second amplifier, a first output matching circuit, a second output matching circuit, and an RF signal output terminal.

The first amplifier includes a first transistor with a large element size, and a second transistor with a smaller element size than the element size of the first transistor.

An input of the first amplifier and an input of the second amplifier are commonly connected to the RF signal input terminal, and an RF input signal can be amplified by the first amplifier and the second amplifier.

An output of the first amplifier is connected to an input of the first output matching circuit, and an output of the second amplifier is connected to an input of the second output matching circuit.

An output of the second output matching circuit is connected to the input of the first output matching circuit, and an output of the first output matching circuit is connected to the RF signal output terminal.

An inductive reactance is connected between the output of the second output matching circuit and the input of the second output matching circuit, and a capacitive reactance is connected between the input of the second output matching circuit and a ground voltage.

If the power amplifier executes power amplification in a high power state, the RF input signal is amplified by the first amplifier, and a first RF amplified output signal of the first amplifier is output to the RF signal output terminal through the first output matching circuit.

If the power amplifier executes power amplification in a low power state, the RF input signal is amplified by the second amplifier, and a second RF amplified output signal of the second amplifier is output to the RF signal output terminal through the second output matching circuit and the first output matching circuit.

If the RF input signal having a first frequency is amplified by the second amplifier in the low power state, the inductive reactance and the capacitive reactance of the second output matching circuit can be set at respective predetermined values.

If the RF input signal having a second frequency that is lower than the first frequency is amplified by the second amplifier in the low power state, at least one reactance of the inductive reactance and the capacitive reactance of the second output matching circuit can be set at a larger value than the predetermined value.

Advantages obtained by representative configurations of various preferred embodiments of the present invention disclosed in this application are briefly described below.

With the preferred embodiments of the present invention, the power amplification in the wide range from the low power state to the high power state is facilitated and enabled, and further the power added efficiency can be increased when the power of the RF input signals having the transmit frequencies in the plurality of frequency bands is amplified.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 21 is a table explaining an operation of the power amplifier PA according to the seventh preferred embodiment of the present invention shown in FIG. 20.

DETAILED DESCRIPTION OF THE PREFERRED EMBODIMENTS

Figure 1:
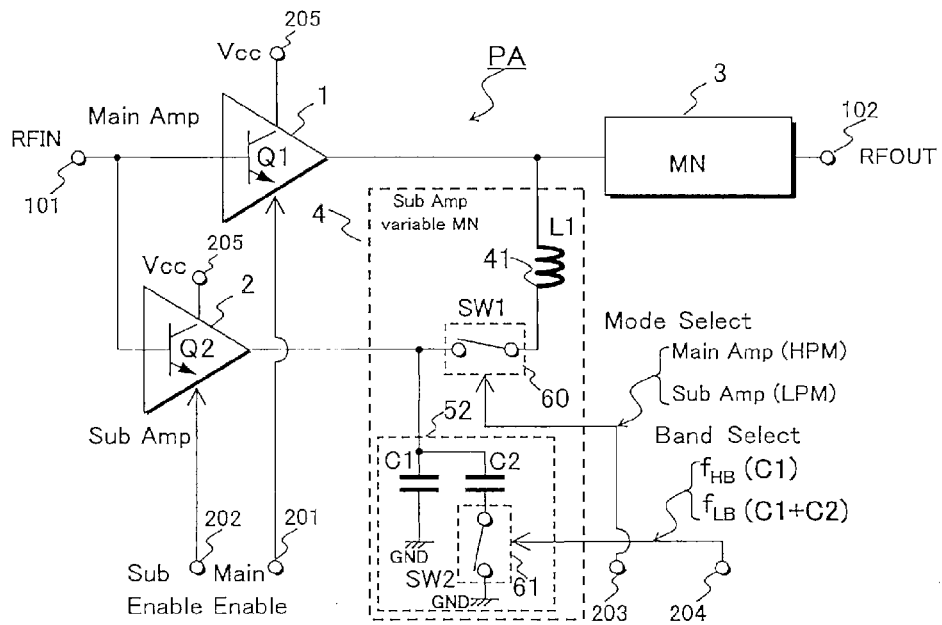
FIG. 1 illustrates a configuration of a power amplifier PA according to a first preferred embodiment of the present invention, to enable power amplification in a wide range from a low power state to a high power state and to increase power added efficiency when power of RF input signals having transmit frequencies in a plurality of frequency bands is amplified.

First, representative preferred embodiments of the present invention disclosed in this application are briefly described. In the brief description for the representative preferred embodiments, reference signs of the drawings, the signs which are parenthesized and referenced in the brief description, merely indicate examples included in the concepts of components with the signs attached.

A power amplifier (PA) according to a representative preferred embodiment of the present invention preferably includes an RF signal input terminal (101), a first amplifier (1), a second amplifier (2), a first output matching circuit (3), a second output matching circuit (4), and an RF signal output terminal (102).

The first amplifier includes a first transistor (Q1) with a large element size to exhibit high power added efficiency in a high power state, and a second transistor (Q2) with a smaller element size than the element size of the first transistor to exhibit high power added efficiency in a low power state.

An input terminal of the first amplifier and an input terminal of the second amplifier are commonly connected to the RF signal input terminal. AN RF input signal that is supplied to the RF signal input terminal can be amplified by the first amplifier and the second amplifier.

An output terminal of the first amplifier is connected to an input terminal of the first output matching circuit. An output terminal of the second amplifier is connected to an input terminal of the second output matching circuit.

An output terminal of the second output matching circuit is connected to the input terminal of the first output matching circuit. An output terminal of the first output matching circuit is connected to the RF signal output terminal.

An inductive reactance (L1) is connected between the output terminal of the second output matching circuit and the input terminal of the second output matching circuit. A capacitive reactance (C1, C2) is connected between the input terminal of the second output matching circuit and a ground voltage (GND).

If the power amplifier executes power amplification in the high power state, the RF input signal is amplified by the first amplifier, and a first RF amplified output signal of the first amplifier can be output to the RF signal output terminal through the first output matching circuit.

If the power amplifier executes power amplification in the low power state, the RF input signal is amplified by the second amplifier, and a second RF amplified output signal of the second amplifier can be output to the RF signal output terminal through the second output matching circuit and the first output matching circuit.

If the power amplifier executes the power amplification in the low power state and the RF input signal having a first frequency ($f_{HB}$) is amplified by the second amplifier, the inductive reactance and the capacitive reactance of the second output matching circuit can be set at respective predetermined values (L1, C1).

If the power amplifier executes the power amplification in the low power state and the RF input signal having a second frequency ($f_{LB}$) that is lower than the first frequency is amplified by the second amplifier, at least one reactance of the inductive reactance and the capacitive reactance of the second output matching circuit can be set at a larger value (C1, C2) than the predetermined value (see FIG. 1).

With this preferred embodiment, the power amplification in the wide range from the low power state to the high power state is allowed, and further the power added efficiency can be increased when the power of the RF input signals having the transmit frequencies in the plurality of frequency bands is amplified.

According to a preferred embodiment of the present invention, if the power amplifier executes the power amplification in the low power state and the RF input signal having the first frequency is amplified by the second amplifier, the capacitive reactance can be set at a predetermined capacitance value (C1).

If the power amplifier executes the power amplification in the low power state and the RF input signal having the second frequency is amplified by the second amplifier, the capacitive reactance can be set at a larger capacitance value (C1+C2) than the predetermined capacitance value (C1) (see FIG. 1).

According to another preferred embodiment of the present invention, if the power amplifier executes the power amplification in the low power state and the RF input signal having the first frequency is amplified by the second amplifier, the inductive reactance can be set at a predetermined inductor value (L1).

Figure 9:
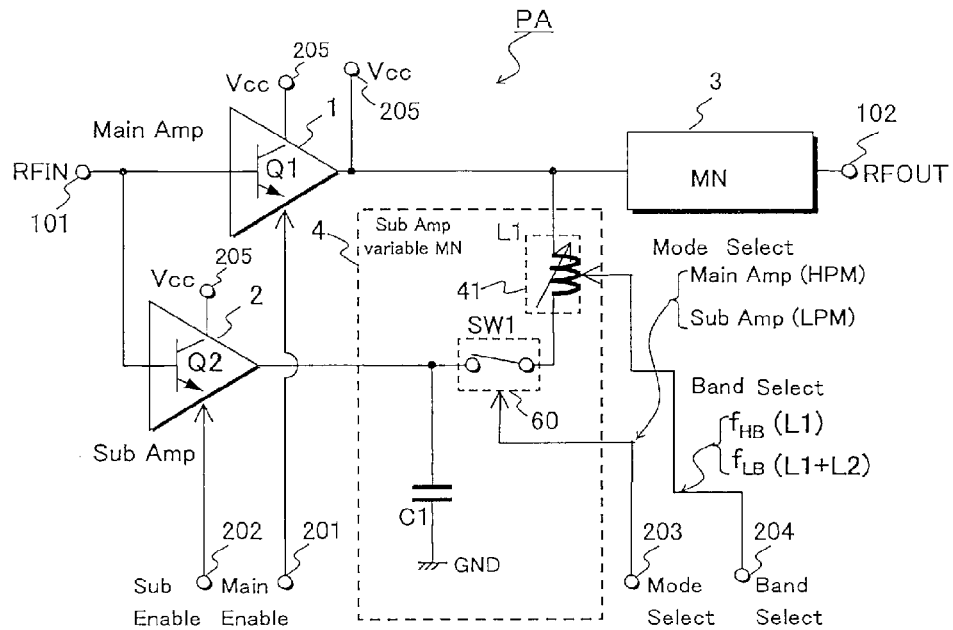
FIG. 9 illustrates a configuration of a power amplifier PA according to a fourth preferred embodiment of the present invention, to enable power amplification in a wide range from a low power state to a high power state and to increase power added efficiency when power of RF input signals having transmit frequencies in a plurality of frequency bands is amplified.

If the power amplifier executes the power amplification in the low power state and the RF input signal having the second frequency is amplified by the second amplifier, the inductive reactance can be set at a larger inductor value (L1+L2) than the predetermined inductor value (L1) (see FIG. 9).

According to still another preferred embodiment, the second output matching circuit can be supplied with a frequency band select signal (Band Select).

If the frequency band select signal is in a first state, the inductive reactance and the capacitive reactance of the second output matching circuit can be set at the predetermined values.

If the frequency band select signal is in a second state that is different from the first state, the one reactance of the second output matching circuit can be set at the larger value (see FIG. 1).

According to yet another preferred embodiment of the present invention, the second output matching circuit preferably includes a first switch (60) that can be supplied with a mode select signal (Mode Select).

If the mode select signal indicates the high power state, the first switch is controlled to be in one of an ON state and an OFF state, and hence the effect of the second output matching circuit to the output terminal of the first amplifier is reduced.

If the mode select signal indicates the low power state, the first switch is controlled to be in the other of the ON state and the OFF state, and hence the second RF amplified output signal of the second amplifier can be supplied to the input terminal of the first output matching circuit through the second output matching circuit including the first switch controlled to be in the other (see FIG. 1).

According to a further preferred embodiment of the present invention, if the power amplifier executes the power amplification in the high power state, the first amplifier is controlled to be in an active state and the second amplifier is controlled to be in a non-active state.

If the power amplifier executes the power amplification in the low power state, the first amplifier is controlled to be in a non-active state and the second amplifier is controlled to be in an active state (see FIG. 1).

According to a still further preferred embodiment of the present invention, the one reactance preferably includes a second switch (61) that can be supplied with the frequency band select signal.

If the frequency band select signal is in the first state, the second switch is controlled to be in one of an ON state and an OFF state, and the second switch controlled to be in the one can set the inductive reactance and the capacitive reactance of the second output matching circuit at the respective predetermined values.

If the frequency band select signal is in the second state, the second switch is controlled to be in the other of the ON state and the OFF state, and the second switch controlled to be in the other can set the one reactance of the second output matching circuit at the larger value (see FIG. 1).

According to a yet further preferred embodiment of the present invention, the inductive reactance and the first switch are connected in series between the input terminal of the second output matching circuit and the output terminal of the second output matching circuit.

The capacitive reactance preferably includes a first capacitance (C1) and a second capacitance (C2).

One end of the first capacitance and one end of the second capacitance are connected to the input terminal of the second output matching circuit, the other end of the first capacitance is connected to the ground voltage, and the other end of the second capacitance is connected to the ground voltage through the second switch (see FIG. 1).

According to a yet further preferred embodiment of the present invention, the capacitive reactance preferably includes a first capacitance and a second capacitance.

Figure 3:
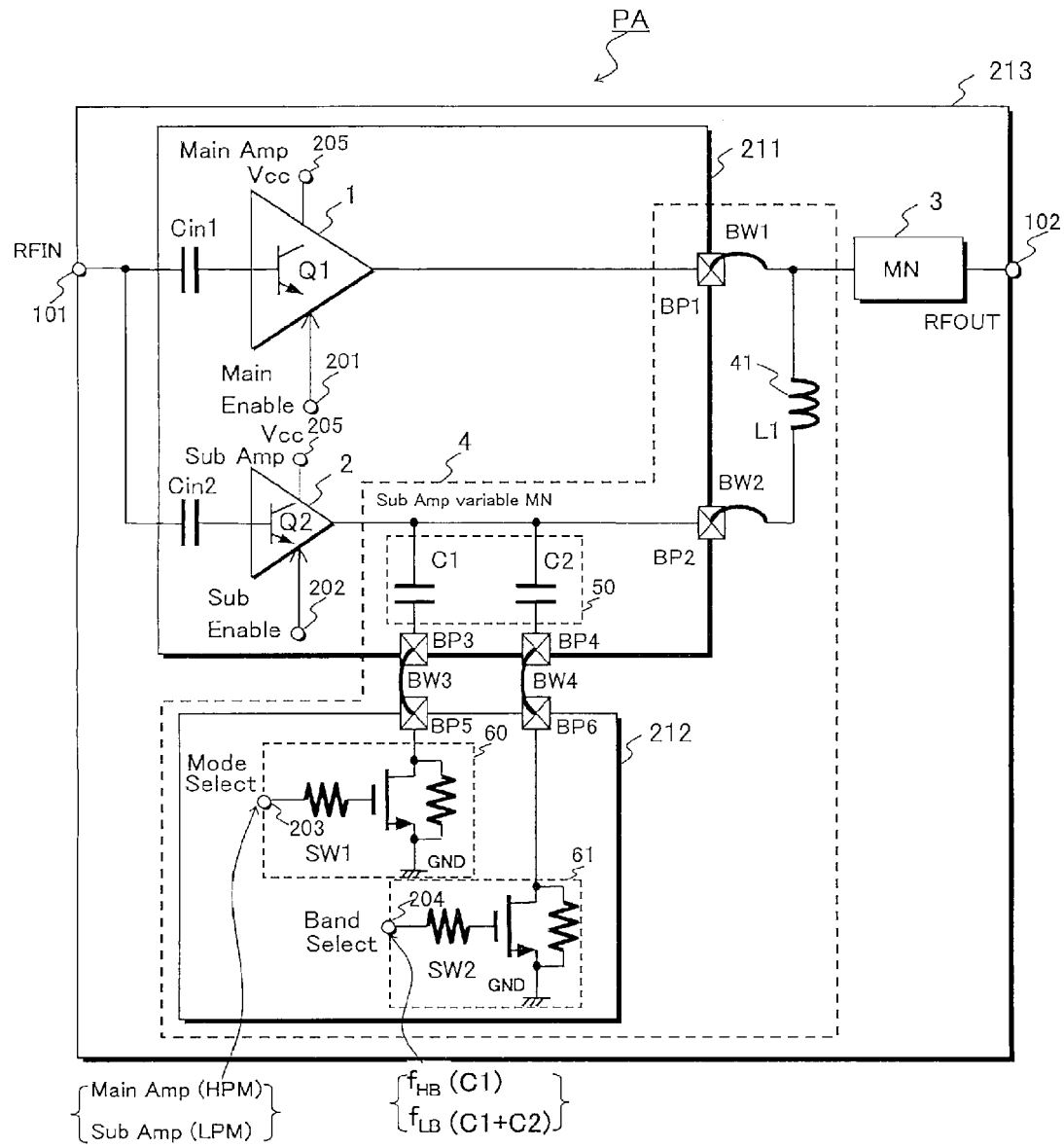
FIG. 3 illustrates a specific configuration of a power amplifier PA according to a second preferred embodiment of the present invention, to enable power amplification in a wide range from a low power state to a high power state and to increase power added efficiency when power of RF input signals having transmit frequencies in a plurality of frequency bands is amplified.

One end of the first capacitance and one end of the second capacitance are connected to the input terminal of the second output matching circuit, the other end of the first capacitance is connected to the ground voltage through the first switch, and the other end of the second capacitance is connected to the ground voltage through the second switch (see FIG. 3).

According to a specific preferred embodiment of the present invention, the second output matching circuit preferably includes another capacitance (C3).

The series-connected first switch and other capacitance are connected in parallel to the inductive reactance between the input terminal of the second output matching circuit and the output terminal of the second output matching circuit.

If the mode select signal indicates the high power state, the first switch is controlled to be in the ON state, and hence a parallel resonance circuit of the other capacitance and the inductive reactance is defined, and the effect of the second output matching circuit to the output terminal of the first amplifier is reduced.

Figure 8:
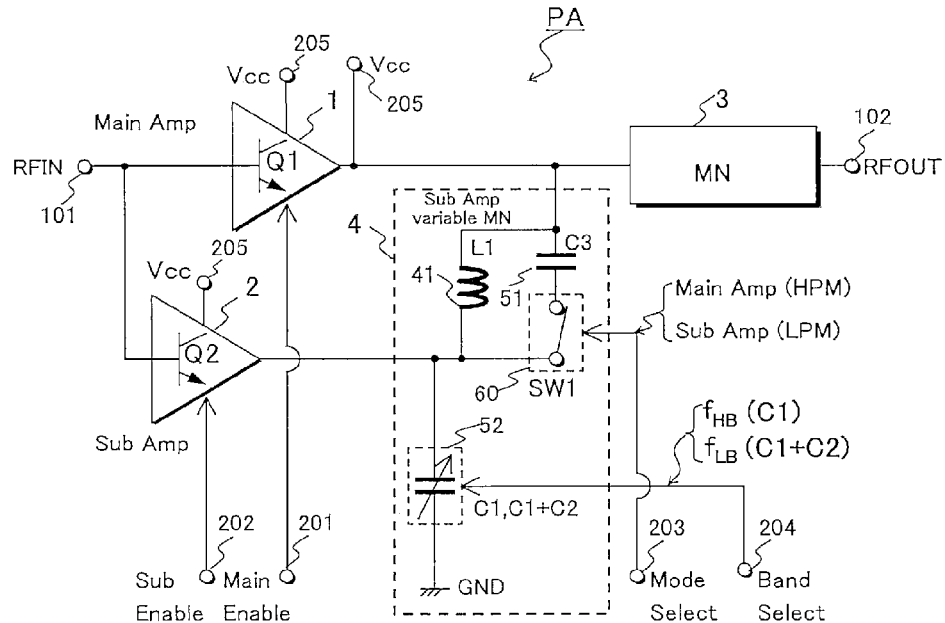
FIG. 8 illustrates a configuration of a power amplifier PA according to the third preferred embodiment of the present invention, to enable power amplification in a wide range from a low power state to a high power state and to increase power added efficiency when power of RF input signals having transmit frequencies in a plurality of frequency bands is amplified.

If the mode select signal indicates the low power state, the first switch is controlled to be in the OFF state, and hence the second RF amplified output signal of the second amplifier can be supplied to the input terminal of the first output matching circuit through the second output matching circuit including the first switch controlled to be in the OFF state (see FIG. 8).

According to another specific preferred embodiment of the present invention, the RF signal input terminal preferably includes a high-band RF signal input terminal (101H) and a low-band RF signal input terminal (101L).

The RF signal output terminal preferably includes a high-band RF signal output terminal (102H) and a low-band RF signal output terminal (102L).

The first amplifier preferably includes a high-band first amplifier (151H) and a low-band first amplifier (151L).

The second amplifier preferably includes a high-band second amplifier (152H) and a low-band second amplifier (152L).

The first output matching circuit preferably includes a high-band first output matching circuit (153H) and a low-band first output matching circuit (153L).

The second output matching circuit preferably includes a high-band second output matching circuit (154H) and a low-band second output matching circuit (154L).

The high-band first amplifier, the high-band second amplifier, the high-band first output matching circuit, and the high-band second output matching circuit can amplify a high-band RF input signal that is supplied to the high-band RF signal input terminal, and output a high-band RF amplified signal to the high-band RF signal output terminal.

The low-band first amplifier, the low-band second amplifier, the low-band first output matching circuit, and the low-band second output matching circuit can amplify a low-band RF input signal that is supplied to the low-band RF signal input terminal, and output a low-band RF amplified signal to the low-band RF signal output terminal.

The power amplifier preferably further includes a control circuit (150) that can receive a band select signal (BS2), at a common terminal.

Figure 18:
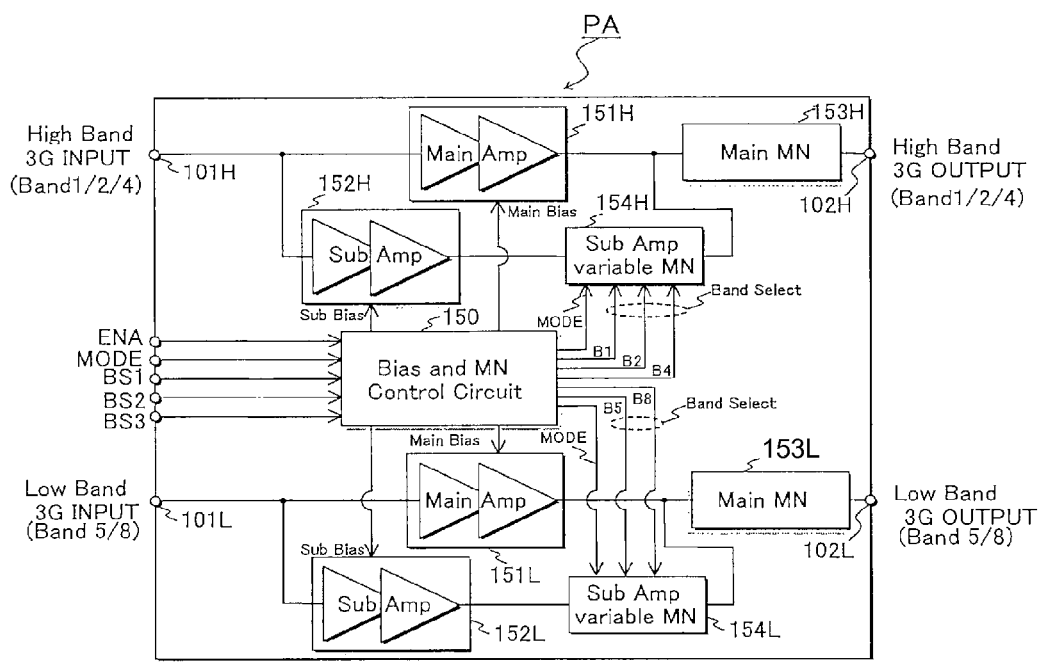
FIG. 18 illustrates a configuration of a power amplifier PA according to a sixth preferred embodiment of the present invention, to enable power amplification in a wide range from a low power state to a high power state and to increase power added efficiency when power of RF input signals having transmit frequencies in a plurality of frequency bands is amplified.

The control circuit can preferably control the high-band second output matching circuit and the low-band second output matching circuit in response to the band select signal that is received by the common terminal (see FIG. 18).

According to still another specific preferred embodiment, the high-band first amplifier, the high-band second amplifier, the high-band first output matching circuit, and the high-band second output matching circuit can amplify the high-band RF input signal of WCDMA system supplied to the high-band RF signal input terminal.

The low-band first amplifier, the low-band second amplifier, the low-band first output matching circuit, and the low-band second output matching circuit can amplify the low-band RF input signal of the WCDMA system supplied to the low-band RF signal input terminal (see FIG. 18).

According to a more specific preferred embodiment of the present invention, the power amplifier preferably further includes a GSM (registered trademark) high-band RF signal input terminal (175H), a GSM low-band RF signal input terminal (175L), a GSM high-band RF signal output terminal (176H), a GSM low-band RF signal output terminal (176L), a GSM high-band amplifier (172H), and a GSM low-band amplifier (172L).

The GSM high-band amplifier is connected between the GSM high-band RF signal input terminal and the GSM high-band RF signal output terminal. The GSM low-band amplifier is connected between the GSM low-band RF signal input terminal and the GSM low-band RF signal output terminal.

The control circuit (170) is arranged to switch the GSM high-band amplifier and the GSM low-band amplifier between a GMSK operation of GSM system and an EDGE operation of the GSM system in response to a mode switch signal (GMODE) that is received by a first common terminal.

The control circuit (170) is arranged to execute operations of ramp-up and ramp-down at a transmission slot of time division multiple access (TDMA) of the GSM system, and an operation of amplitude modulation of EDGE system, for the GSM high-band amplifier and the GSM low-band amplifier, in response to a ramp voltage (VRAMP) that is received by a second common terminal.

Figures 19, 20:
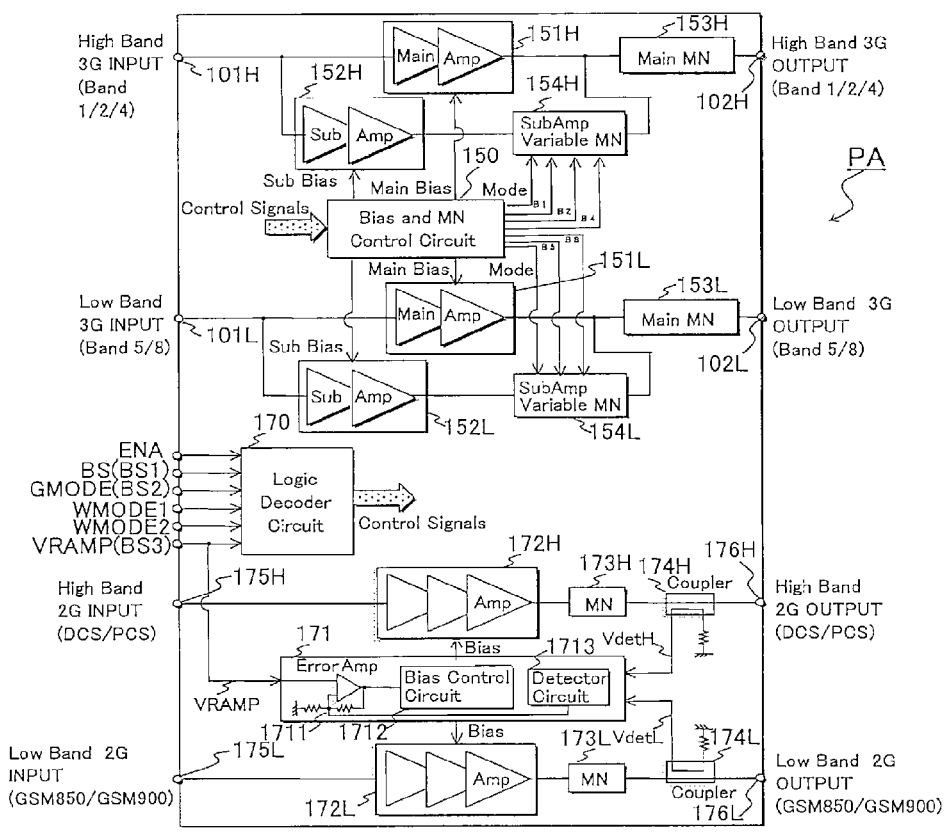
FIG. 19 is a table explaining an operation of the power amplifier PA according to the sixth preferred embodiment of the present invention shown in FIG. 18.
FIG. 20 illustrates a configuration of a power amplifier PA according to a seventh preferred embodiment of the present invention, to enable power amplification in a wide range from a low power state to a high power state and to increase power added efficiency when power of RF input signals having transmit frequencies in a plurality of frequency bands is amplified.

The control circuit is arranged to control the high-band second output matching circuit and the low-band second output matching circuit in response to a plurality of band select signals that are received by the first common terminal and the second common terminal (see FIG. 20).

A representative preferred embodiment of the present invention provides an operating method of a power amplifier (PA) preferably including an RF signal input terminal (101), a first amplifier (1), a second amplifier (2), a first output matching circuit (3), a second output matching circuit (4), and an RF signal output terminal (102).

The first amplifier preferably includes a first transistor (Q1) with a large element size to exhibit high power added efficiency in a high power state, and a second transistor (Q2) with a smaller element size than the element size of the first transistor to exhibit high power added efficiency in a low power state.

An input terminal of the first amplifier and an input terminal of the second amplifier are commonly connected to the RF signal input terminal. AN RF input signal that is supplied to the RF signal input terminal can be amplified by the first amplifier and the second amplifier.

An output terminal of the first amplifier is connected to an input terminal of the first output matching circuit. An output terminal of the second amplifier is connected to an input terminal of the second output matching circuit.

An output terminal of the second output matching circuit is connected to the input terminal of the first output matching circuit. An output terminal of the first output matching circuit is connected to the RF signal output terminal.

An inductive reactance (L1) is connected between the output terminal of the second output matching circuit and the input terminal of the second output matching circuit. A capacitive reactance (C1, C2) is connected between the input terminal of the second output matching circuit and a ground voltage (GND).

If the power amplifier executes power amplification in the high power state, the RF input signal is amplified by the first amplifier, and a first RF amplified output signal of the first amplifier is output to the RF signal output terminal through the first output matching circuit.

If the power amplifier executes power amplification in the low power state, the RF input signal is amplified by the second amplifier, and a second RF amplified output signal of the second amplifier is output to the RF signal output terminal through the second output matching circuit and the first output matching circuit.

If the power amplifier executes the power amplification in the low power state and the RF input signal having a first frequency ($f_{HB}$) is amplified by the second amplifier, the inductive reactance and the capacitive reactance of the second output matching circuit are set at respective predetermined values (L1, C1).

If the power amplifier executes the power amplification in the low power state and the RF input signal having a second frequency ($f_{LB}$) that is lower than the first frequency is amplified by the second amplifier, at least one reactance of the inductive reactance and the capacitive reactance of the second output matching circuit is set at a larger value (C1, C2) than the predetermined value (see FIG. 1).

With the above generally-described preferred embodiments of the present invention, the power amplification in the wide range from the low power state to the high power state is enabled and facilitated, and further the power added efficiency can be increased when the power of the RF input signals having the transmit frequencies in the plurality of frequency bands is amplified.

Next, preferred embodiments of the present invention will be described in more detail. In all drawings for explaining preferred embodiments for implementing the present invention, the same reference signs are applied to components having the same functions as those in the aforementioned drawings, and the redundant description is omitted.

First Preferred Embodiment

FIG. 1 illustrates a configuration of a power amplifier PA according to a first preferred embodiment of the present invention, to enable power amplification in a wide range from a low power state to a high power state and to increase power added efficiency when power of RF input signals having transmit frequencies in a plurality of frequency bands is amplified.

The power amplifier PA according to the first preferred embodiment of the present invention shown in FIG. 1 preferably includes a first amplifier 1 with a large element size, a second amplifier 2 with a small element size, a first output matching circuit 3, and a second output matching circuit 4.

The first amplifier 1 is arranged to function as a main amplifier including a transistor with a large element size to exhibit high power added efficiency (PAE) in a high power state, and the second amplifier 2 functions as a sub amplifier including a transistor with a small element size to exhibit high power added efficiency (PAE) in a low power state.

When the first amplifier 1 is operated, a first amplifier enable signal is supplied to a first control terminal 201. When the second amplifier 2 is operated, a second amplifier enable signal is supplied to a second control terminal 202. For example, the first amplifier enable signal and the second amplifier enable signal can be preferably generated from one of an RF signal processing semiconductor integrated circuit and a base band processor mounted on the cellular phone terminal.

An input terminal of the first amplifier 1 and an input terminal of the second amplifier 2 are commonly connected to an RF signal input terminal 101 of the power amplifier PA.

AN RF input signal RFIN that is supplied to the RF signal input terminal 101 is amplified by the first amplifier 1 or the second amplifier 2. The RF input signal RFIN that is supplied to the RF signal input terminal 101 can be generated from a transmit signal generation circuit unit of the RF signal processing semiconductor integrated circuit mounted on the cellular phone terminal.

A ground terminal of the first amplifier 1 and a ground terminal of the second amplifier 2 are preferably commonly connected to a ground terminal of the power amplifier PA. A ground electrode of the power amplifier PA is electrically connected to ground wiring of a mother board of the cellular phone with a very small wiring resistance. Hence, the first amplifier 1 and the second amplifier 2 execute a markedly stable RF amplification operation. Further, the ground terminal of the power amplifier PA is mechanically connected to the ground wiring of the mother board of the cellular phone with a very small thermal resistance. Hence, Joule heat that is generated from the first amplifier 1 and the second amplifier 2 can be effectively radiated from the mother board of the cellular phone.

An output terminal of the first amplifier 1 is connected to an input terminal of the first output matching circuit 3, and an output terminal of the second amplifier 2 is connected to an input terminal of the second output matching circuit 4. An output terminal of the second output matching circuit 4 is connected to the input terminal of the first output matching circuit 3, and an output terminal of the first output matching circuit 3 is connected to an output terminal 102 of the power amplifier PA.

In the first amplifier 1, an input electrode and a ground electrode of a transistor Q1 with a large element size are respectively connected to the input terminal and the ground terminal of the first amplifier 1. An output electrode of the transistor Q1 with the large element size is preferably connected to a power terminal 205 of the power amplifier PA through a first load. The output electrode of the transistor Q1 with the large element size is connected to the output terminal of the first amplifier 1.

In the second amplifier 2, an input electrode and a ground electrode of a transistor Q2 with a small element size are respectively connected to the input terminal and the ground terminal of the second amplifier 2. An output electrode of the transistor Q2 with the small element size is preferably connected to a power terminal 205 of the power amplifier PA through a second load. The output electrode of the transistor Q2 with the small element size is connected to the output terminal of the second amplifier 2.

The first amplifier 1 has a relatively small output impedance because of the transistor Q1 with the large element size of the first amplifier 1. In contrast, the second amplifier 2 has a relatively large output impedance because of the transistor Q2 with the small element size of the second amplifier 2. For example, the output impedance of the first amplifier 1 is several ohms, and the output impedance of the second amplifier 2 is several tens of ohms. In the power amplifier PA according to the first preferred embodiment of the present invention shown in FIG. 1, the transistors Q1 and Q2 are each preferably provided by a hetero-junction bipolar transistor (HBT) integrated on a compound semiconductor chip of, for example, GaAs.

As described above, if the transistors Q1 and Q2 of the power amplifier PA are each provided by the hetero-junction bipolar transistor (HBT), the element size is set in accordance with an emitter area $A_E$. In general, a power transistor of a power amplifier is provided by a plurality of parallel-connected unit transistors. A unit transistor includes a predetermined emitter area $A_E$. Also, the number of the plurality of parallel-connected transistors is called a "finger number". Hence, the element size of the hetero-junction bipolar transistor (HBT) is set in accordance with the finger number.

In another example of a preferred embodiment of the present invention, the transistors Q1 and Q2 of the power amplifier PA can be each provided by a LD-type N-channel power MOS transistor. The element size in this case is set by gate width Wg/gate length Lg. In general, a power transistor of a power amplifier is provided by a plurality of parallel-connected unit transistors. A unit transistor has a predetermined gate parameter Wg/Lg. Hence, the element size of the LD-type MOS transistor is also set in accordance with the finger number. LD stands for laterally diffused.

In the first output matching circuit 3, the input terminal of which is connected to the output terminal of the first amplifier 1, preferably executes matching between an output impedance of several ohms of the first amplifier 1 and an impedance of a transmit antenna of 50Ω, for example, which is connected to the output terminal 102 of the first output matching circuit 3. That is, an input impedance of the first output matching circuit 3 is preferably set at several ohms, and hence the output impedance of the first amplifier 1 and the input impedance of the first output matching circuit 3 are matched. Consequently, reflection of the RF signal can be sufficiently reduced between the output of the first amplifier 1 and the input of the first output matching circuit 3. Further, an output impedance of the first output matching circuit 3 is preferably set at 50Ω, and hence the output impedance of the first output matching circuit 3 and the input impedance of the transmit antenna of 50Ω are matched. Consequently, reflection of the RF signal can be sufficiently reduced between the output of the first output matching circuit 3 and the input of the transmit antenna. The first output matching circuit 3 can be provided by a plurality of inductors and a plurality of capacitances.

Figure 22A:
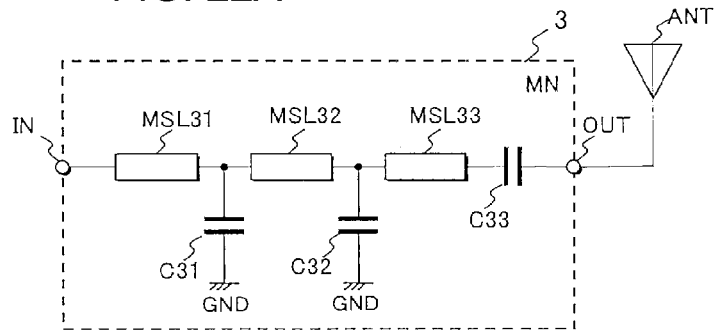
FIGS. 22A-22C illustrate a configuration of a first output matching circuit 3 included in the power amplifier PA according to the first preferred embodiment of the present invention shown in FIG. 1.
Figure 22B:
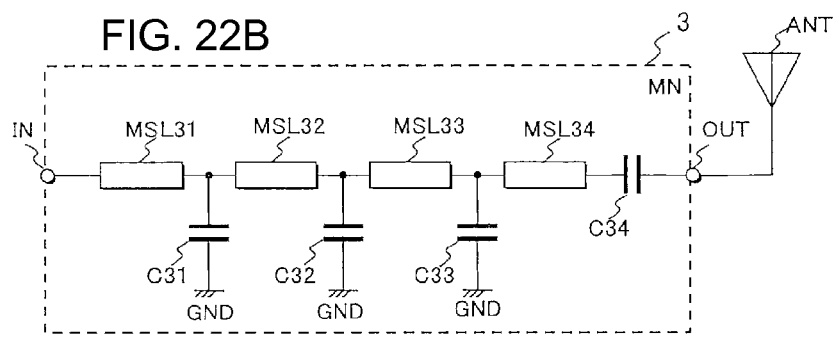
Figure 22C:
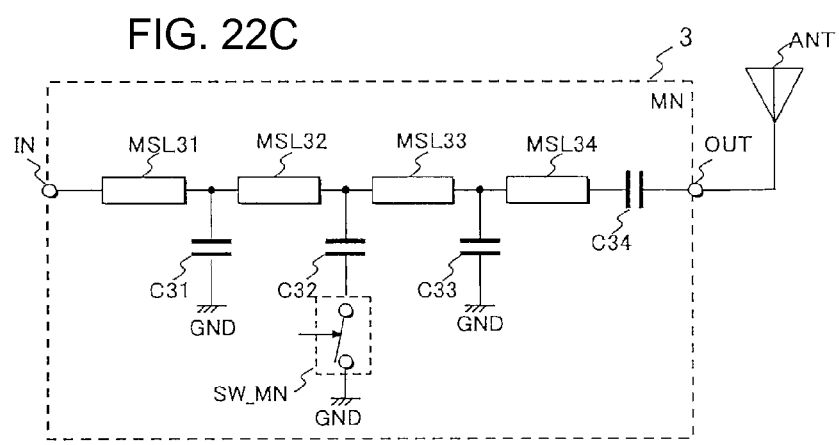
Figure 23:
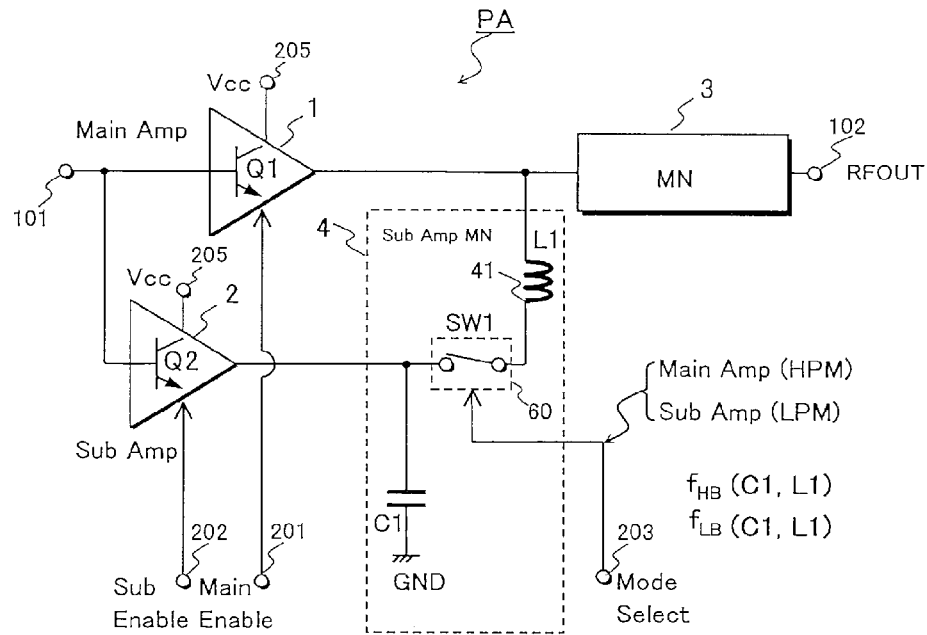
FIG. 23 illustrates a configuration of a conventional power amplifier PA.
Figure 24:
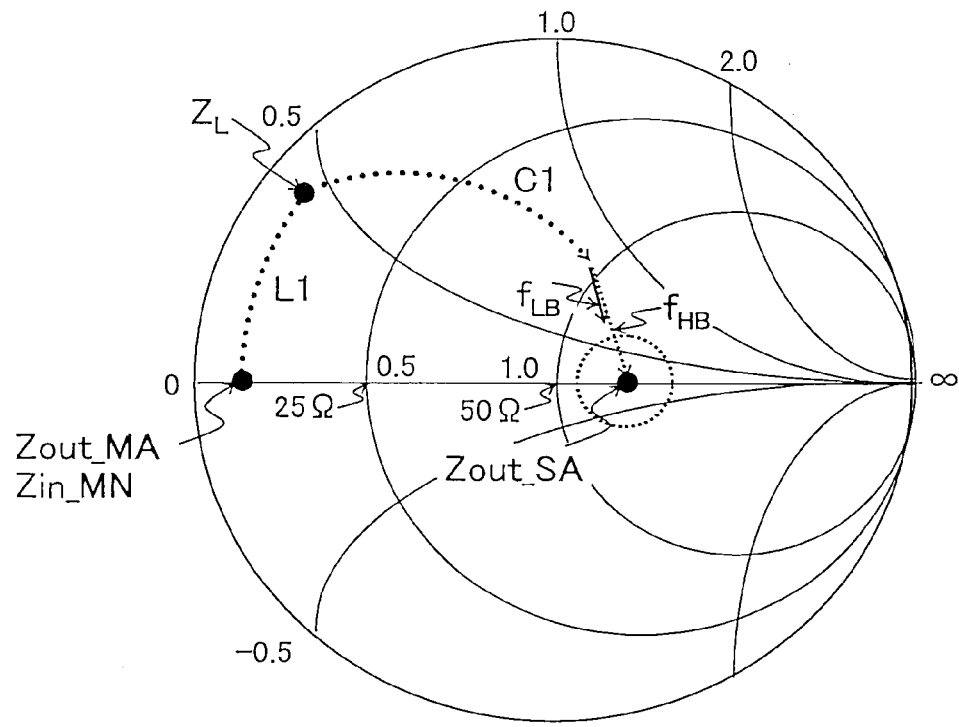
FIG. 24 illustrates a Smith chart explaining an operation of a second output matching circuit 4 of the conventional power amplifier PA shown in FIG. 23.

FIGS. 22A-22C illustrate a configuration of the first output matching circuit 3 included in the power amplifier PA according to the first preferred embodiment of the present invention shown in FIG. 1.

A first output matching circuit 3 shown in FIG. 22A is preferably provided by three micro strip lines MSL31, MSL32, and MSL33 as inductors, and three capacitances C31, C32, and C33, for example. An input terminal IN of the first output matching circuit 3 is connected to the output terminal of the first amplifier 1. An output terminal OUT of the first output matching circuit 3 is connected to a transmit antenna ANT with an impedance of about 50Ω, for example. The three micro strip lines MSL31, MSL32, and MSL33, and the capacitance C33 are preferably connected in series between the input terminal IN and the output terminal OUT of the first output matching circuit 3. The capacitance C31 is connected between a connection node of the micro strip lines MSL31 and MSL32, and a ground voltage GND. The capacitance C32 is connected between a connection node of the micro strip lines MSL32 and MSL33, and the ground voltage GND.

A first output matching circuit 3 shown in FIG. 22B is preferably provided by four micro strip lines MSL31, MSL32, MSL33, and MSL34 as inductors, and four capacitances C31, C32, C33, and C34. An input terminal IN of the first output matching circuit 3 is connected to the output terminal of the first amplifier 1. An output terminal OUT of the first output matching circuit 3 is connected to a transmit antenna ANT with an impedance of about 50Ω, for example. The four micro strip lines MSL31, MSL32, MSL33, and MSL34, and the capacitance C34 are connected in series between the input terminal IN and the output terminal OUT of the first output matching circuit 3. The capacitance C31 is connected between a connection node of the micro strip lines MSL31 and MSL32, and a ground voltage GND. The capacitance C32 is connected between a connection node of the micro strip lines MSL32 and MSL33, and a ground voltage GND. The capacitance C33 is connected between a connection node of the micro strip lines MSL33 and MSL34, and the ground voltage GND.

A first output matching circuit 3 shown in FIG. 22C is provided by adding a switch SW_MN between the capacitance C32 included in the first output matching circuit 3 shown in FIG. 22B and a ground voltage GND. That is, in the first output matching circuit 3 shown in FIG. 22C, the capacitance C32 becomes a use state by controlling the switch SW_MN to an ON state, and the capacitance C32 becomes a non-use state by controlling the switch SW_MN to be in an OFF state.

The second output matching circuit 4 included in the power amplifier PA according to the first preferred embodiment of the present invention shown in FIG. 1 executes matching between an output impedance of several tens of ohms of the second amplifier 2 and the input impedance of several ohms of the first output matching circuit 3. That is, an input impedance of the second output matching circuit 4 is preferably set at several tens of ohms, and hence the output impedance of the second amplifier 2 and the input impedance of the second output matching circuit 4 are matched. Consequently, reflection of the RF signal can be sufficiently reduced between the output of the second amplifier 2 and the input of the second output matching circuit 4. Further, an output impedance of the second output matching circuit 4 is set at several ohms, and hence the output impedance of the second output matching circuit 4 and the input impedance of the first output matching circuit 3 are matched. Consequently, reflection of the RF signal can be sufficiently reduced between the output of the second output matching circuit 4 and the input of the first output matching circuit 3.

The second output matching circuit 4 included in the power amplifier PA according to the first preferred embodiment of the present invention shown in FIG. 1 is preferably provided by an inductor (L1) 41, a variable capacitance circuit 52, and a first switch (SW1) 60.

One end of the inductor (L1) 41 is connected to the output terminal of the first amplifier 1, the input terminal of the first output matching circuit 3, and the output terminal of the second output matching circuit 4. The other end of the inductor (L1) 41 is connected to the output terminal of the second amplifier 2 and the input terminal of the second output matching circuit 4. The variable capacitance circuit 52 is connected to the output terminal of the second amplifier 2 and the input terminal of the second output matching circuit 4. The variable capacitance circuit 52 includes a first capacitance C1, a second capacitance C2, and a second switch (SW2) 61. One end of the first capacitance C1 and one end of the second capacitance are connected to the output terminal of the second amplifier 2 and the input terminal of the second output matching circuit 4. The other end of the first capacitance C1 is connected to the ground potential GND. The other end of the second capacitance C2 is connected to a ground potential GND through the second switch (SW2) 61. The second switch (SW2) 61 is preferably controlled by a frequency band select signal that is supplied to a frequency band select terminal 204. For example, the frequency band select signal that is supplied to the frequency band select terminal 204 can be also generated from one of the RF signal processing semiconductor integrated circuit and the base band processor mounted on the cellular phone terminal.

If the frequency band select signal that is supplied to the frequency band select terminal 204 selects a high-band transmit frequency $f_{HB}$, the second switch (SW2) 61 is controlled to be in an OFF state, and a capacitance value of the variable capacitance circuit 52 is determined by only the first capacitance C1. If the frequency band select signal that is supplied to the frequency band select terminal 204 selects a low-band transmit frequency $f_{LB}$, the second switch (SW2) 61 is controlled to be in an ON state, and the capacitance value of the variable capacitance circuit 52 is determined by a parallel capacitance of the first capacitance C1 and the second capacitance C2.

Also, in the second output matching circuit 4 included in the power amplifier PA according to the first preferred embodiment of the present invention shown in FIG. 1, the first capacitance C1 is preferably set at a capacitance value of about 6 pF, the second capacitance C2 is set at a capacitance value of about 2 pF, and the inductor (L1) 41 is preferably set at an inductance of about 3 nH, for example.

In the power amplifier PA according to the first preferred embodiment of the present invention shown in FIG. 1, if power amplification in the high power state is executed, the first amplifier 1 becomes an active state by a high-level first amplifier enable signal that is supplied to the first control terminal 201, and the second amplifier 2 becomes a non-active state by a low-level second amplifier enable signal that is supplied to the second control terminal 202. In this case, the first switch (SW1) 60 is controlled to be in the OFF state by a low-level high power mode signal HPM that is supplied to a mode select terminal 203. Hence, the first switch (SW1) 60 in the OFF state reduces the effect of the second output matching circuit 4 to the output terminal of the first amplifier 1. In the power amplifier PA according to the first preferred embodiment of the present invention shown in FIG. 1, the first switch (SW1) 60 is preferably connected between the inductor (L1) 41 and the variable capacitance circuit 52. The high power mode signal HPM that is supplied to the mode select terminal 203 can be also generated from one of the RF signal processing semiconductor integrated circuit and the base band processor mounted on the cellular phone terminal.

As described above, if the power amplifier PA executes the power amplification in the high power state, an amplification operation of amplifying the RF input signal RFIN having the high-band transmit frequency $f_{HB}$ by the first amplifier 1, and an amplification operation of amplifying the RF input signal RFIN having the low-band transmit frequency $f_{LB}$ are equivalent operations.

In the power amplifier PA according to the first preferred embodiment of the present invention shown in FIG. 1, if power amplification in the low power state is executed, the first amplifier 1 becomes a non-active state by a low-level first amplifier enable signal that is supplied to the first control terminal 201, and the second amplifier 2 becomes an active state by a high-level second amplifier enable signal that is supplied to the second control terminal 202. In this case, the first switch (SW1) 60 is controlled to be in the ON state by a high-level low power mode signal LPM that is supplied to the mode select terminal 203. Hence, an RF amplified output signal of the output terminal of the second amplifier 2 is supplied to the input terminal of the first output matching circuit 3 through the second output matching circuit 4 including the first switch (SW1) 60 in the ON state. The low power mode signal LPM that is supplied to the mode select terminal 203 can be also generated from one of the RF signal processing semiconductor integrated circuit and the base band processor mounted on the cellular phone terminal.

As described above, when the power amplifier PA executes power amplification in the low power state, if the RF input signal RFIN having the high-band transmit frequency $f_{HB}$ is amplified by the second amplifier 2, the frequency band select signal that is supplied to the frequency band select terminal 204 selects the high-band transmit frequency $f_{HB}$. Hence, the second switch (SW2) 61 is controlled to be in the OFF state, and the capacitance value of the variable capacitance circuit 52 is determined by only the first capacitance C1.

As described above, when the power amplifier PA executes power amplification in the low power state, if the RF input signal RFIN having the low-band transmit frequency $f_{LB}$ is amplified by the second amplifier 2, the frequency band select signal that is supplied to the frequency band select terminal 204 selects the low-band transmit frequency $f_{LB}$. Hence, the second switch (SW2) 61 is controlled to be in the ON state, and the capacitance value of the variable capacitance circuit 52 is determined by a parallel capacitance of the first capacitance C1 and the second capacitance C2.

As described above, if the power amplifier PA executes the power amplification in the low power state, an amplification operation of amplifying the RF input signal RFIN having the high-band transmit frequency $f_{HB}$ by the second amplifier 2, and an amplification operation of amplifying the RF input signal RFIN having the low-band transmit frequency $f_{LB}$ are different operations. For example, the frequency band select signal that is supplied to the frequency band select terminal 204 can also be generated from one of the RF signal processing semiconductor integrated circuit and the base band processor mounted on the cellular phone terminal.

Figure 2:
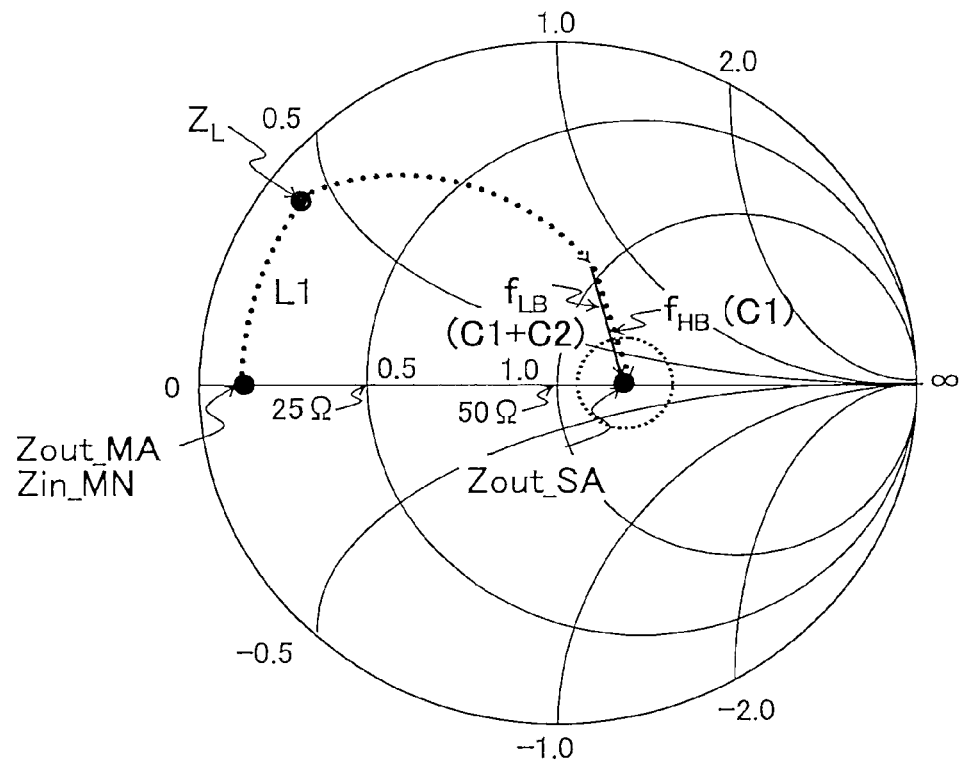
FIG. 2 illustrates a Smith chart explaining an operation of a second output matching circuit 4 included in the power amplifier PA according to the first preferred embodiment of the present invention shown in FIG. 1.

FIG. 2 illustrates a Smith chart explaining an operation of the second output matching circuit 4 included in the power amplifier PA according to the first preferred embodiment of the present invention shown in FIG. 1.

In FIG. 2, for easier understanding of the operation, it is assumed that an output impedance Zout_SA of the second amplifier 2 is a larger value than the actual several tens of ohms.

In FIG. 2, a relatively small output impedance Zout_MA of the first amplifier 1 and a relatively large output impedance Zout_SA of the second amplifier 2 are indicated on a line that connects a point at which a resistance value is zero (0) and a point at which the resistance value is infinity (∞). The relatively small output impedance Zout_MA of the first amplifier 1 is located at a slightly right side with respect to the point at which the resistance value is the zero (0). The relatively large output impedance Zout_SA of the second amplifier 2 is indicated at the right side of a point at which the resistance value is 50Ω; however, the output impedance Zout_SA is actually located between a point at which the resistance value is 25Ω and the point at which the resistance value is 50Ω.

Further, FIG. 2 indicates an input impedance Zin_MN of the first output matching circuit 3. The input impedance Zin_MN is matched to an impedance that is equivalent or substantially equivalent to the relatively small output impedance Zout_MA of the first amplifier 1.

Hence, if the first amplifier 1 is controlled to be in the non-active state by the first amplifier enable signal that is supplied to the first control terminal 201, and if the second amplifier 2 is controlled to be in the active state by the second amplifier enable signal that is supplied to the second control terminal 202, the second output matching circuit 4 has to execute an impedance matching operation between the output impedance Zout_SA of the second amplifier 2 and the input impedance Zin_MN of the first output matching circuit 3 as follows.

Hence, if the RF input signal RFIN having the high-band transmit frequency $f_{HB}$ is amplified by the second amplifier 2 of the power amplifier PA according to the first preferred embodiment of the present invention shown in FIG. 1, the capacitance value of the variable capacitance circuit 52 is determined by only the first capacitance C1. Consequently, as shown in FIG. 2, by using only the first capacitance C1, the destination obtained by the sum total of a moving amount ωL1 of the inductor L1 and a moving amount ωC1 of the capacitance C1 can be matched to the output impedance Zout_SA of the second amplifier 2.

In contrast, if the RF input signal RFIN having the low-band transmit frequency $f_{LB}$ is amplified by the second amplifier 2 of the power amplifier PA according to the first preferred embodiment of the present invention shown in FIG. 1, the capacitance value of the variable capacitance circuit 52 is determined by the parallel capacitance of the first capacitance C1 and the second capacitance C2. Consequently, as shown in FIG. 2, by using the parallel capacitance of the first capacitance C1 and the second capacitance C2, the destination obtained by the sum total of the moving amount ωL1 of the inductor L1 and a moving amount ω(C1+C2) of the parallel capacitance C1+C2 can be matched to the output impedance Zout_SA of the second amplifier 2.

Second Preferred Embodiment

FIG. 3 illustrates a configuration of a power amplifier PA according to a second preferred embodiment of the present invention, to enable power amplification in a wide range from a low power state to a high power state and to increase power added efficiency when power of RF input signals having transmit frequencies in a plurality of frequency bands is amplified.

The specific power amplifier PA according to the second preferred embodiment of the present invention shown in FIG. 3 is preferably different from the power amplifier PA according to the first preferred embodiment of the present invention shown in FIG. 1 in the following points.

First, the variable capacitance circuit 52 of the power amplifier PA shown in FIG. 1 is preferably replaced with a capacitance circuit 50, a first switch (SW1) 60, and a second switch (SW2) 61 of the power amplifier PA shown in FIG. 3.

The specific power amplifier PA according to the second preferred embodiment of the present invention shown in FIG. 3 is preferably provided by a compound semiconductor chip 211, a silicon semiconductor chip 212, and a module wiring board 213. That is, a first amplifier 1, a second amplifier 2, and a first capacitance C1 and a second capacitance C2 of the capacitance circuit 50 are integrated on the compound semiconductor chip 211 of, for example, GaAs, and a MOS transistor that defines the first switch (SW1) 60 and a MOS transistor that defines the second switch (SW2) 61 are integrated on the silicon semiconductor chip 212. Further, a first output matching circuit 3 and an inductor (L1) 41 of a second output matching circuit 4 are arranged on the module wiring board 213. Also, in the capacitance circuit 50, the first capacitance C1 is set at a relatively large capacitance value of about 6 pF, and the second capacitance C2 is set at a relatively small capacitance value of about 2 pF.

AN RF signal input terminal 101 of the power amplifier PA is connected to an input terminal of the first amplifier 1 and an input terminal of the second amplifier 2 through a first input capacitance Cin1 and a second input capacitance Cin2. AN RF input signal RFIN that is supplied to the RF signal input terminal 101 is amplified by the first amplifier 1 or the second amplifier 2.

A first bonding pad BP1 that functions as an output terminal of the first amplifier 1 is preferably connected to an input terminal of the first output matching circuit 3 and to one end of the inductor (L1) 41 of the second output matching circuit 4 through a first bonding wire BW1, and a second bonding pad BP2 that functions as an output terminal of the second amplifier 2 is preferably connected to the other end of the inductor (L1) 41 of the second output matching circuit 4 through a second bonding wire BW2.

One end of the first capacitance C1 and one end of the second capacitance C2 of the capacitance circuit 50 are connected to the output terminal of the second amplifier 2. A third bonding pad BP3 that functions as the other end of the first capacitance C1 is preferably connected to a fifth bonding pad BP5 through a third bonding wire BW3. A fourth bonding pad BP4 that functions as the other end of the second capacitance C2 is preferably connected to a sixth bonding pad BP6 through a fourth bonding wire BW4. On the silicon semiconductor chip 212, a drain/source current path of the MOS transistor that defines the first switch (SW1) 60 is connected between the fifth bonding pad BP5 and a ground potential, and a drain/source current path of the MOS transistor that defines the second switch (SW2) 61 is connected between the sixth bonding pad BP6 and the ground potential.

A gate of the MOS transistor of the first switch (SW1) 60, the gate which functions as a mode select terminal 203, can be supplied with a low-level high power mode signal HPM and a high-level low power mode signal LPM. A gate of the MOS transistor of the second switch (SW2) 61, the gate which functions as a frequency band select terminal 204 can preferably be supplied with a high-band select signal and a low-band select signal.

In the power amplifier PA according to the second preferred embodiment of the present invention shown in FIG. 3, execution of power amplification in a high power state is described. Regarding a power amplification operation in the high power state, a case of amplifying the RF input signal RFIN having a high-band transmit frequency $f_{HB}$, and a case of amplifying the RF input signal RFIN having a low-band transmit frequency $f_{LB}$ are equivalent operations.

In the power amplification operation in the high power state, the first amplifier 1 becomes an active state by a high-level first amplifier enable signal that is supplied to a first control terminal 201, and the second amplifier 2 becomes a non-active state by a low-level second amplifier enable signal that is supplied to a second control terminal 202. Hence, the first switch (SW1) 60 is controlled to be in an OFF state by the low-level high power mode signal HPM that is supplied to the mode select terminal 203, and the second switch (SW2) 61 is controlled to be in an OFF state by the low-level control signal that is supplied to the frequency band select terminal 204. Hence, the first switch (SW1) 60 in the OFF state and the second switch (SW2) 61 in the OFF state reduce the effect of the second output matching circuit 4 to the output terminal of the first amplifier 1.

While the first switch (SW1) 60 is connected in series to the RF signal path of the second output matching circuit 4 in the power amplifier PA according to the first preferred embodiment of the present invention shown in FIG. 1, the first switch (SW1) 60 is preferably connected between an RF signal path of the second output matching circuit 4 and the ground potential GND in the power amplifier PA according to the second preferred embodiment of the present invention shown in FIG. 3. Consequently, in the power amplifier operation in the low power state by the power amplifier PA according to the first preferred embodiment of the present invention shown in FIG. 1, a portion of an RF amplified output signal of the second amplifier 2 has a loss in the first switch (SW1) 60 on the RF signal path of the output matching circuit 4. In contrast, in the power amplification operation in the low power state of the power amplifier PA according to the second preferred embodiment of the present invention shown in FIG. 3, the RF signal loss on the RF signal path of the output matching circuit 4 can preferably be reduced.

According to the second preferred embodiment of the present invention shown in FIG. 3, if the power amplification in the low power state is executed, the first amplifier 1 becomes a non-active state by a low-level first amplifier enable signal that is supplied to the first control terminal 201, and the second amplifier 2 becomes an active state by a high-level second amplifier enable signal that is supplied to the second control terminal 202. Further, the first switch (SW1) 60 is controlled to be in an ON state by a high-level low power mode signal LPM that is supplied to the mode select terminal 203, and in the capacitance circuit 50, the first capacitance C1 preferably set at a relatively large capacitance value of about 6 pF can be used.

If the second amplifier 2 amplifies the RF input signal RFIN of the high-band transmit frequency $f_{HB}$, a low-level high-band select signal is supplied to the frequency band select terminal 204. Hence the second switch (SW2) 61 is controlled to be in the OFF state, and the capacitance value of the capacitance circuit 50 is determined by only the first capacitance C1 of about 6 pF.

Consequently, as shown in FIG. 2, by using only the first capacitance C1, the destination obtained by the sum total of the moving amount ωL1 of the inductor L1 and the moving amount ωC1 of the capacitance C1 can be matched to the output impedance Zout_SA of the second amplifier 2.

If the second amplifier 2 amplifies the RF input signal RFIN of the low-band transmit frequency $f_{LB}$, the high-level low-band select signal is supplied to the frequency band select terminal 204. Hence the second switch (SW2) 61 is controlled to be in an ON state, and the capacitance value of the capacitance circuit 50 is preferably determined by a parallel capacitance of the first capacitance C1 of about 6 pF and the second capacitance C2 of about 2 pF, for example.

Consequently, as shown in FIG. 2, by using the parallel capacitance of the first capacitance C1 and the second capacitance C2, the destination obtained by the sum total of the moving amount ωL1 of the inductor L1 and the moving amount ω(C1+C2) of the parallel capacitance C1+C2 can be matched to the output impedance Zout_SA of the second amplifier 2.

Figure 4:
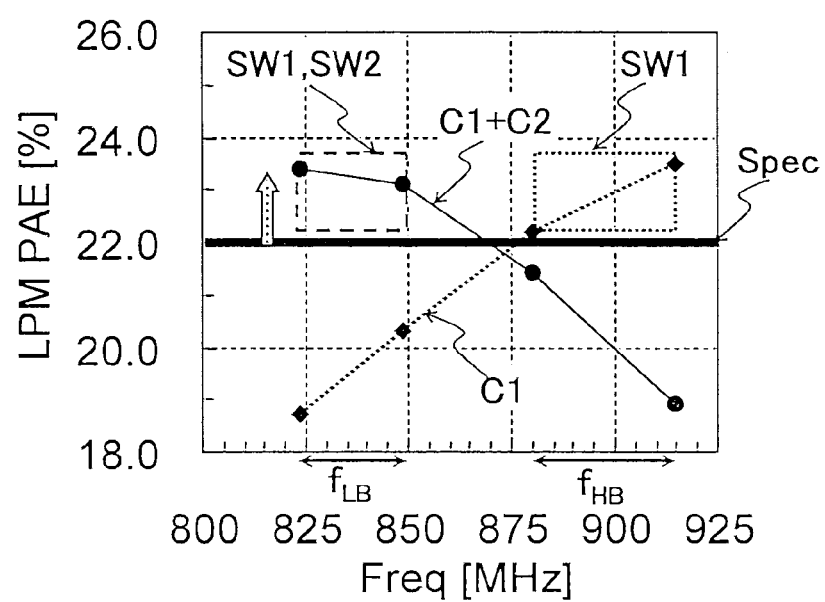
FIG. 4 illustrates power added efficiency (PAE) when the power amplifier PA according to the second preferred embodiment of the present invention shown in FIG. 3 is operated in a low power mode LPM.

FIG. 4 illustrates power added efficiency (PAE) when the power amplifier PA according to the second preferred embodiment of the present invention shown in FIG. 3 is operated in a low power mode LPM.

The horizontal axis in FIG. 4 expresses the transmit frequency of the RF input signal RFIN that is supplied to the RF signal input terminal 101, and the vertical axis in FIG. 4 expresses the power added efficiency (PAE) of the power amplifier PA in FIG. 3.

In the low power mode LPM, power amplification in the low power state is executed. Power of the RF input signal RFIN that is supplied to the RF signal input terminal 101 is amplified by the second amplifier 2 and then the signal is transmitted to the output terminal 102 of the power amplifier PA through the second output matching circuit 4 and the first output matching circuit 3.

If power of an RF input signal RFIN with a high transmit frequency $f_{HB}$ called Band 8 of WCDMA system in a range from about 880 MHz to about 915 MHz is amplified by the second amplifier 2 in the amplification operation in the low power mode LPM, only the first capacitance C1 can be used because of the first switch (SW1) 60 in the ON state in the capacitance circuit 50 as indicated by broken lines in FIG. 4. Consequently, in the amplification operation in the low power mode LPM of Band 8 of the WCDMA system in the range from about 880 MHz to about 915 MHz, the power added efficiency (PAE) of the power amplifier PA in FIG. 3 can achieve a target specification (spec) of about 22% or higher, for example. WCDMA stands for wideband code division multiple access.

If power an RF input signal RFIN with a low transmit frequency $f_{LB}$ called Band 5 of the WCDMA system in a range from about 829 MHz to about 949 MHz is amplified by the second amplifier 2 in the amplification operation in the low power mode LPM, the parallel capacitance of the first capacitance C1 and the second capacitance C2 can be used because of the first switch (SW1) 60 in the ON state and the second switch (SW2) 61 in the ON state in the capacitance circuit 50 as indicated by solid lines in FIG. 4. Consequently, in the amplification operation in the low power mode LPM of Band 5 of the WCDMA system in the range from about 829 MHz to about 949 MHz, the power added efficiency (PAE) of the power amplifier PA in FIG. 3 can achieve the target specification (Spec) of about 22% or higher, for example.

Figure 5:
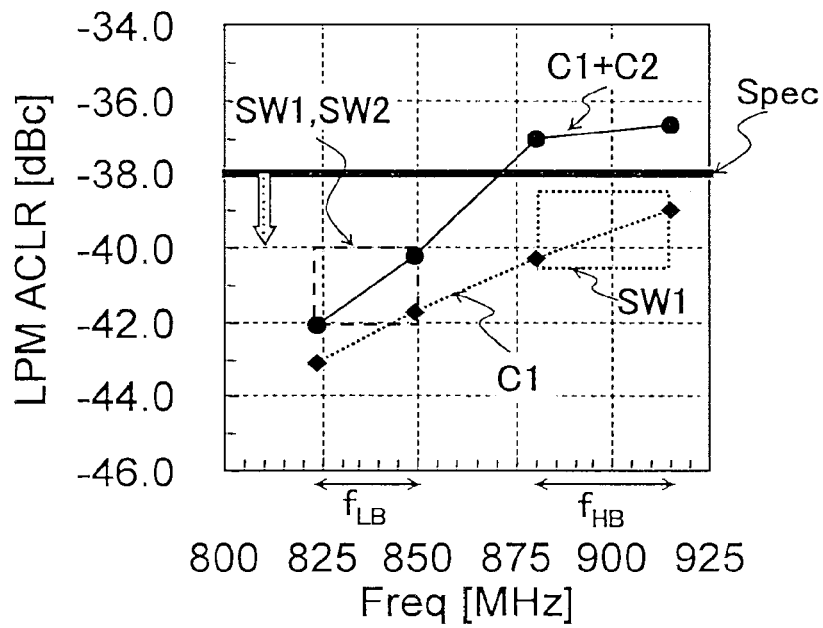
FIG. 5 illustrates an adjacent channel power leakage ratio (ACLR) when the power amplifier PA according to the second preferred embodiment of the present invention shown in FIG. 3 is operated in the low power mode LPM.

FIG. 5 illustrates an adjacent channel power leakage ratio (ACLR) when the power amplifier PA according to the second preferred embodiment of the present invention shown in FIG. 3 is operated in the low power mode LPM. The adjacent channel power leakage ratio (ACLR) in the power amplifier PA is a parameter that indicates a magnitude of a disturbing signal that leaks from a desired transmit channel to an adjacent channel as the result of signal distortion through the power amplification of the RF input signal RFIN by the power amplifier PA.

The horizontal axis in FIG. 5 expresses the transmit frequency of the RF input signal RFIN that is supplied to the RF signal input terminal 101, and the vertical axis in FIG. 5 expresses the adjacent channel power leakage ratio (ACLR) of the power amplifier PA in FIG. 3.

If the power the RF input signal RFIN with the high transmit frequency $f_{HB}$ called Band 8 of the WCDMA system in the range from about 880 MHz to about 915 MHz is amplified by the second amplifier 2 in the amplification operation in the low power mode LPM, only the first capacitance C1 can be used because of the first switch (SW1) 60 in the ON state in the capacitance circuit 50 as indicated by broken lines in FIG. 5. Consequently, in the amplification operation in the low power mode LPM of Band 8 of the WCDMA system in the range from about 880 MHz to about 915 MHz, the adjacent channel power leakage ratio (ACLR) of the power amplifier PA in FIG. 3 can achieve a target specification (Spec) of about −38 dBc or smaller, for example.

If the power the RF input signal RFIN with the low transmit frequency $f_{LB}$ called Band 5 of the WCDMA system in the range from about MHz 829 to about 949 MHz is amplified in the amplification operation in the low power mode LPM, the parallel capacitance of the first capacitance C1 and the second capacitance C2 can be used because of the first switch (SW1) 60 in the ON state and the second switch (SW2) 61 in the ON state in the capacitance circuit 50 as indicated by solid lines in FIG. 5. Consequently, in the amplification operation in the low power mode LPM of Band 5 of the WCDMA system in the range from about 829 MHz to about 949 MHz, the power added efficiency (PAE) of the power amplifier PA in FIG. 3 can achieve the target specification (Spec) of about −38 dBc or smaller, for example.

Third Preferred Embodiment

Figure 6:
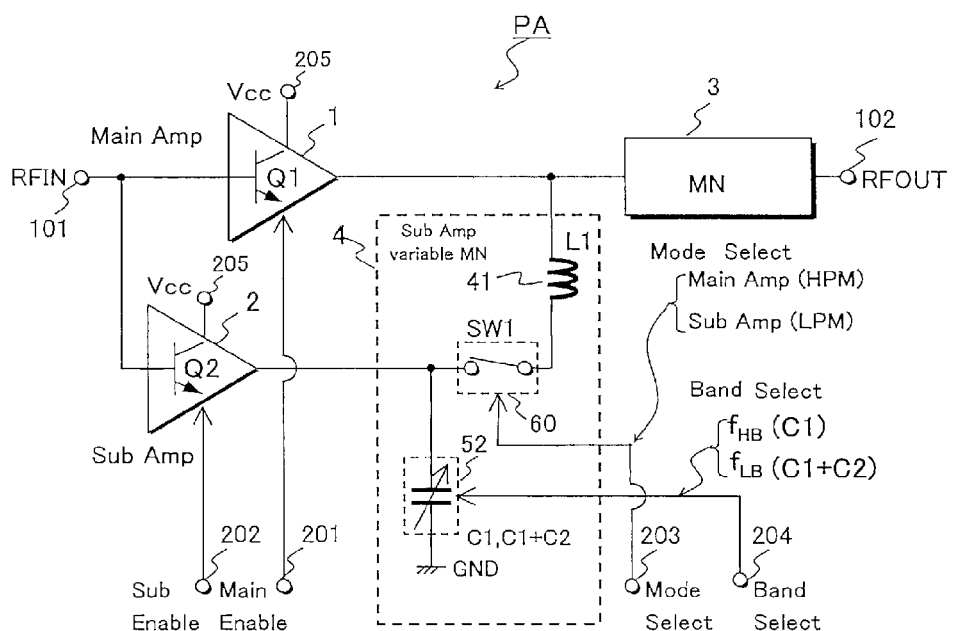
FIG. 6 illustrates a configuration of a power amplifier PA according to a third preferred embodiment of the present invention, to enable power amplification in a wide range from a low power state to a high power state and to increase power added efficiency when power of RF input signals having transmit frequencies in a plurality of frequency bands is amplified.

FIG. 6 illustrates a configuration of a power amplifier PA according to a third preferred embodiment of the present invention, to enable power amplification in a wide range from a low power state to a high power state and to increase power added efficiency when power of RF input signals having transmit frequencies in a plurality of frequency bands is amplified.

The specific power amplifier PA according to the third preferred embodiment of the present invention shown in FIG. 6 is preferably different from the power amplifier PA according to the first preferred embodiment of the present invention shown in FIG. 1 in the following points.

That is, in the power amplifier PA according to the third preferred embodiment of the present invention shown in FIG. 6, any of various switches can be used for the first switch (SW1) 60 that is connected between the inductor (L1) 41 of the second output matching circuit 4 and the variable capacitance circuit 52, and any of various capacitances can be used for the variable capacitance circuit 52 of the second output matching circuit 4.

Figure 7:
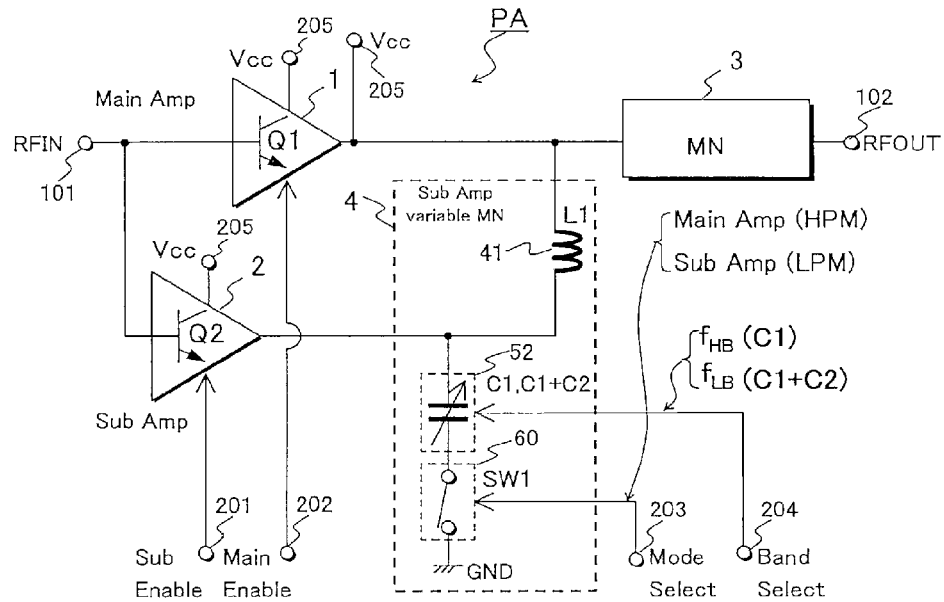
FIG. 7 illustrates a configuration of a power amplifier PA according to the third preferred embodiment of the present invention, to enable power amplification in a wide range from a low power state to a high power state and to increase power added efficiency when power of RF input signals having transmit frequencies in a plurality of frequency bands is amplified.

FIG. 7 illustrates a configuration of a power amplifier PA according to the third preferred embodiment of the present invention, to enable power amplification in a wide range from a low power state to a high power state and to increase power added efficiency when power of RF input signals having transmit frequencies in a plurality of frequency bands is amplified.

The power amplifier PA according to the third preferred embodiment of the present invention shown in FIG. 7 is preferably different from the power amplifier PA according to the second preferred embodiment of the present invention shown in FIG. 3 in the following points.

That is, in the power amplifier PA according to the third preferred embodiment of the present invention shown in FIG. 7, any of various capacitances can be used for the variable capacitance circuit 52 of the second output matching circuit 4, and any of various switches can be used for the first switch (SW1) 60 that is connected between the variable capacitance circuit 52 and the ground voltage GND.

FIG. 8 illustrates a configuration of a power amplifier PA according to the third preferred embodiment of the present invention, to enable power amplification in a wide range from a low power state to a high power state and to increase power added efficiency when power of RF input signals having transmit frequencies in a plurality of frequency bands is amplified.

The specific power amplifier PA according to the third preferred embodiment of the present invention shown in FIG. 8 is preferably different from the power amplifier PA according to the first preferred embodiment of the present invention shown in FIG. 1 in the following point.

That is, in the power amplifier PA according to the third preferred embodiment of the present invention shown in FIG. 8, if power amplification in a high power state is executed, a separation circuit that reduces the effect of the second output matching circuit 4 to the output terminal of the first amplifier 1 is provided by a third capacitance C3, the first switch (SW1) 60, and the inductor (L1) 41. In this separation circuit, the inductor (L1) 41 is connected in parallel to the series-connected third capacitance C3 and first switch (SW1) 60. The separation circuit is in a form of a LC parallel resonance circuit.

If the power amplifier PA according to the third preferred embodiment of the present invention shown in FIG. 8 executes power amplification in the high power state, the first switch (SW1) 60 is controlled to be in the ON state by a low-level high power mode signal HPM that is supplied to the mode select terminal 203, and the separation circuit for the LC parallel resonance circuit of the third capacitance C3 and the inductor (L1) 41 is defined.

If power of an RF input signal RFIN with a high transmit frequency $f_{HB}$ is amplified by the first amplifier 1, an impedance of the separation circuit, which is provided by the parallel resonance circuit of the third capacitance C3 and the inductor (L1) 41, is set at a very large value. Hence, if the power amplifier PA according to the third preferred embodiment of the present invention shown in FIG. 8 executes power amplification in the high power state, the effect of the second output matching circuit 4 to the output terminal of the first amplifier 1 can be sufficiently reduced.

If the power amplifier PA according to the third preferred embodiment of the present invention shown in FIG. 8 executes power amplification in the low power state, the first switch (SW1) 60 is controlled to be in the OFF state by a high-level low power mode signal HLPM that is supplied to the mode select terminal 203, and the separation circuit for the LC parallel resonance circuit of the third capacitance C3 and the inductor (L1) 41 is not provided. Hence, the RF amplified output signal from the output terminal of the second amplifier 2 can be supplied to the input terminal of the first output matching circuit 3 through the RF signal path between the input terminal and the output terminal of the second output matching circuit 4 including the variable capacitance circuit 52 and the inductor (L1) 41.

Also in the power amplifier PA according to the third preferred embodiment of the present invention shown in FIG. 8, any of various switches can be used for the first switch (SW1) 60 of the LC parallel resonance circuit of the second output matching circuit 4, and any of various capacitances can be used for the variable capacitance circuit 52 of the second output matching circuit 4.

Figure 15A:
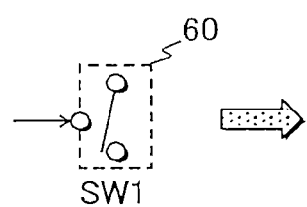
FIGS. 15A-15C illustrate configurations of various switches each of which can be used for a first switch (SW1) 60 in the power amplifier PA according to the third preferred embodiment of the present invention shown in any of FIGS. 6, 7, and 8.
Figure 15B:
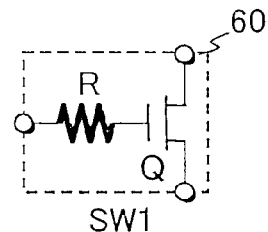
Figure 15C:
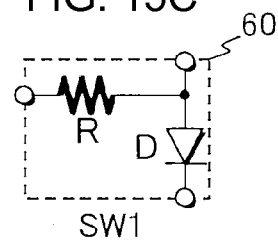

FIGS. 15A-15C illustrate configurations of various switches each of which can be used for the first switch (SW1) 60 in the power amplifier PA according to the third preferred embodiment of the present invention shown in any of FIGS. 6, 7, and 8.

The first switch (SW1) 60 shown in FIG. 15A can be specifically provided by a resistance R and a transistor Q as shown in FIG. 15B. The transistor Q can use a field effect transistor or a bipolar transistor of MOS type or MES type. When a control signal is supplied to a control electrode of the transistor Q through the resistance R, an impedance of an output current path of the transistor Q becomes small, and hence the transistor Q can be operated as a switching element.

The first switch (SW1) 60 shown in FIG. 15A can be specifically provided by a resistance R and a PIN diode D as shown in FIG. 15C. The PIN diode D includes an intrinsic semiconductor at a junction portion of pn junction. The PIN diode D with forward bias becomes an ON state, and the PIN diode D with reverse bias becomes an OFF state. That is, if a voltage that is supplied to the PIN diode D through the resistance R is forward bias, a portion between an anode and a cathode of the PIN diode D becomes an ON state, and if the voltage that is supplied to the PIN diode D through the resistance R is reverse bias, the portion between the anode and the cathode of the PIN diode D becomes OFF state.

Figure 16A:
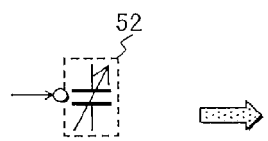
FIGS. 16A-16D illustrate configurations of various variable capacitance circuits each of which can be used for a variable capacitance circuit 52 in the power amplifier PA according to the third preferred embodiment of the present invention shown in any of FIGS. 6, 7, and 8.
Figure 16B:
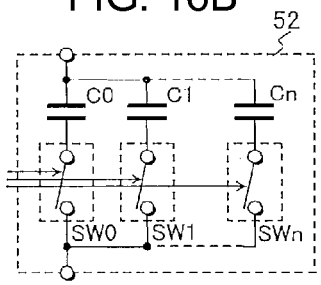
Figure 16C:
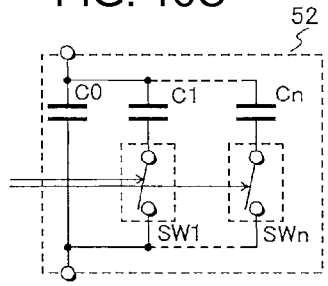

FIGS. 16A-16C illustrate configurations of various variable capacitance circuits each of which can be used for the variable capacitance circuit 52 in the power amplifier PA according to the third preferred embodiment of the present invention shown in any of FIGS. 6, 7, and 8.

The variable capacitance circuit 52 shown in FIG. 16A is specifically provided by a plurality of capacitances C0, C1, . . . , and Cn, and a plurality of switches SW0, SW1, . . . , and SWn as shown in FIG. 16B. The first capacitance C0 and the first switch SW0 are preferably connected in series, the second capacitance C1, and the second switch SW1 are preferably connected in series, and the last capacitance Cn and the last switch SWn are preferably connected in series. The plural series-connected portions are preferably connected in parallel between two terminals of the variable capacitance circuit 52. Each of the plurality of switches SW0, SW1, . . . , and SWn can use any of the various switches shown in FIGS. 15A-15C.

The variable capacitance circuit 52 shown in FIG. 16A is specifically provided by a plurality of capacitances C0, C1, . . . , and Cn, and a plurality of switches SW1, . . . , and SWn as shown in FIG. 16C. The first capacitance C0 is preferably connected between two terminals of the variable capacitance circuit 52. The second capacitance C1 and the second switch SW1 are preferably connected in series, and the last capacitance Cn and the last switch SWn are preferably connected in series. The plural series-connected portions are preferably connected in parallel between the two terminals of the variable capacitance circuit 52. Each of the plurality of switches SW1, . . . , and SWn can use any of the various switches shown in FIG. 15.

Figure 16D:
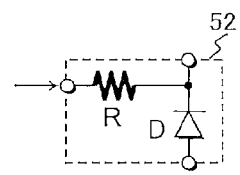

The variable capacitance circuit 52 shown in FIG. 16A can be specifically provided by a resistance R and a variable capacitance diode D as shown in FIG. 16D. A variable capacitance diode D, which is called varactor diode, is set so that a depletion-layer capacitance of pn junction has high voltage dependency. Hence, in response to a change in application voltage that is supplied to the variable capacitance diode D through the resistance R, the capacitance between the cathode and anode of the variable capacitance diode D is continuously changed.

Fourth Preferred Embodiment

FIG. 9 illustrates a configuration of a power amplifier PA according to a fourth preferred embodiment of the present invention, to enable power amplification in a wide range from a low power state to a high power state and to increase power added efficiency when power of RF input signals having transmit frequencies in a plurality of frequency bands is amplified.

The power amplifier PA according to the fourth preferred embodiment of the present invention shown in FIG. 9 is preferably different from the power amplifier PA according to the third preferred embodiment of the present invention shown in FIG. 6 in the following points.

That is, the variable capacitance circuit 52 in the power amplifier PA according to the third preferred embodiment of the present invention shown in FIG. 6 is preferably replaced with a first capacitance C1 with a fixed capacitance value of about 6 pF in the power amplifier PA according to the fourth preferred embodiment of the present invention shown in FIG. 9. The fixed inductor (L1) 41 with the inductance of about 3 nH included in the power amplifier PA according to the third preferred embodiment of the present invention shown in FIG. 6 is preferably replaced with a variable inductor circuit (L1) 41 with a variable inductance in the power amplifier PA according to the fourth preferred embodiment of the present invention shown in FIG. 9.

Figure 10:
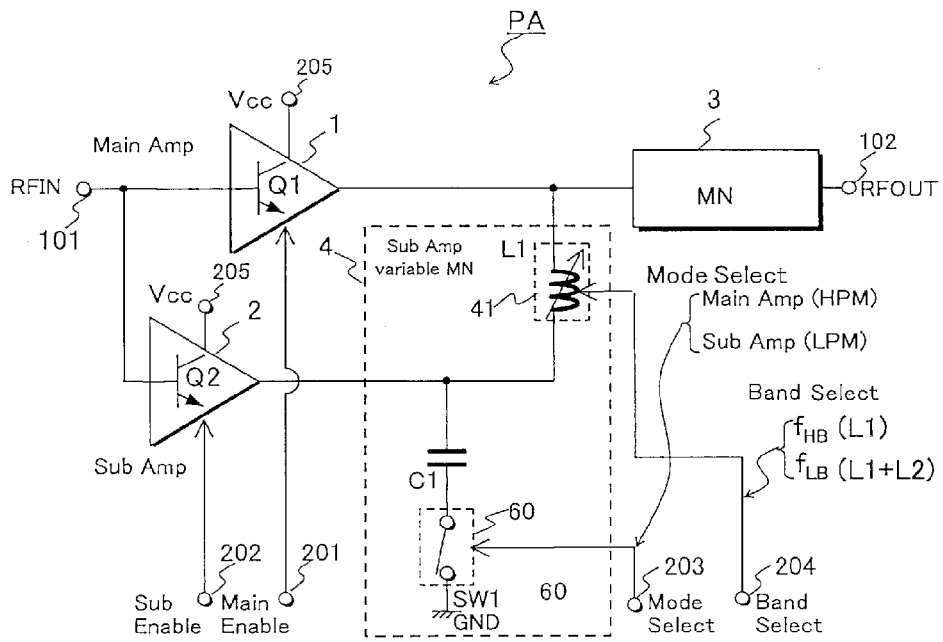
FIG. 10 illustrates a configuration of a power amplifier PA according to the fourth preferred embodiment of the present invention, to enable power amplification in a wide range from a low power state to a high power state and to increase power added efficiency when power of RF input signals having transmit frequencies in a plurality of frequency bands is amplified.

FIG. 10 illustrates a configuration of a power amplifier PA according to the fourth preferred embodiment of the present invention, to enable power amplification in a wide range from a low power state to a high power state and to increase power added efficiency when power of RF input signals having transmit frequencies in a plurality of frequency bands is amplified.

The power amplifier PA according to the fourth preferred embodiment of the present invention shown in FIG. 10 is preferably different from the power amplifier PA according to the third preferred embodiment of the present invention shown in FIG. 7 in the following points.

That is, the variable capacitance circuit 52 in the power amplifier PA according to the third preferred embodiment of the present invention shown in FIG. 7 is preferably replaced with a first capacitance C1 with a fixed capacitance value of about 6 pF in the power amplifier PA according to the fourth preferred embodiment of the present invention shown in FIG. 10. The fixed inductor (L1) 41 with the inductance of about 3 nH included in the power amplifier PA according to the third preferred embodiment of the present invention shown in FIG. 7 is replaced with a variable inductor circuit (L1) 41 with a variable inductance in the power amplifier PA according to the fourth preferred embodiment of the present invention shown in FIG. 10.

Figure 11:
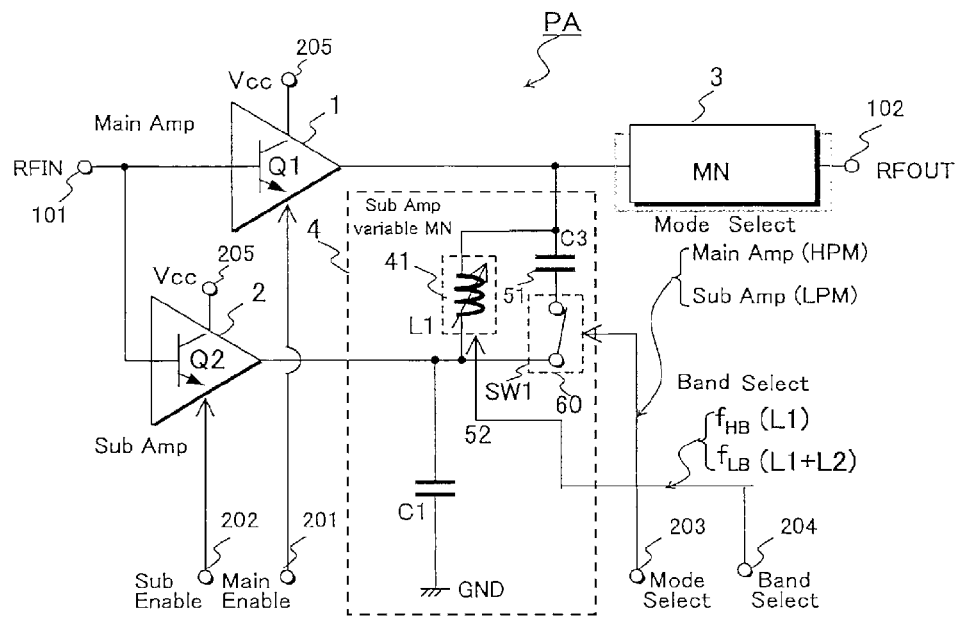
FIG. 11 illustrates a configuration of a power amplifier PA according to the fourth preferred embodiment of the present invention, to enable power amplification in a wide range from a low power state to a high power state and to increase power added efficiency when power of RF input signals having transmit frequencies in a plurality of frequency bands is amplified.

FIG. 11 illustrates a configuration of a power amplifier PA according to the fourth preferred embodiment of the present invention, to enable power amplification in a wide range from a low power state to a high power state and to increase power added efficiency when power of RF input signals having transmit frequencies in a plurality of frequency bands is amplified.

The power amplifier PA according to the fourth preferred embodiment of the present invention shown in FIG. 11 is preferably different from the power amplifier PA according to the third preferred embodiment of the present invention shown in FIG. 8 in the following points.

That is, the variable capacitance circuit 52 in the power amplifier PA according to the third preferred embodiment of the present invention shown in FIG. 8 is preferably replaced with a first capacitance C1 with a fixed capacitance value of about 6 pF in the power amplifier PA according to the fourth preferred embodiment of the present invention shown in FIG. 11. The fixed inductor (L1) 41 with the inductance of about 3 nH of the LC parallel resonance circuit of the separation circuit in the power amplifier PA according to the third preferred embodiment of the present invention shown in FIG. 8 is replaced with a variable inductor circuit (L1) 41 with a variable inductance in the power amplifier PA according to the fourth preferred embodiment of the present invention shown in FIG. 11.

If the second amplifier 2 executes an amplification operation in the power amplifier PA according to the fourth preferred embodiment of the present invention shown in any of FIGS. 9, 10, and 11, when the frequency band select signal that is supplied to the frequency band select terminal 204 selects the high-band transmit frequency $f_{HB}$, the inductance of the variable inductor circuit (L1) 41 is determined by a first inductor L1. Consequently, by using the first inductor L1, the destination obtained by the sum total of the moving amount $\omega L1$ of the inductor L1 and the moving amount $\omega C1$ of the capacitance C1 can be matched to the output impedance Zout_SA of the second amplifier 2.

If the second amplifier 2 executes an amplification operation in the power amplifier PA according to the fourth preferred embodiment of the present invention shown in either of FIGS. 9, 10, and 11, when the frequency band select signal that is supplied to the frequency band select terminal 204 selects the low-band transmit frequency $f_{LB}$, the inductance of the variable inductor circuit (L1) 41 is determined by the total inductance of the first inductor L1 and a second inductor L2.

Consequently, by using the total inductance of the first inductor L1 and the second inductor L2 of the variable inductor circuit (L1) 41, the destination obtained by the sum total of a moving amount ω(L1+L2) of the total inductor L1+L2 and the moving amount ωC1 of the capacitance C1 can be matched to the output impedance Zout_SA of the second amplifier 2.

Figures 17A, 17B, 17C, 17D:
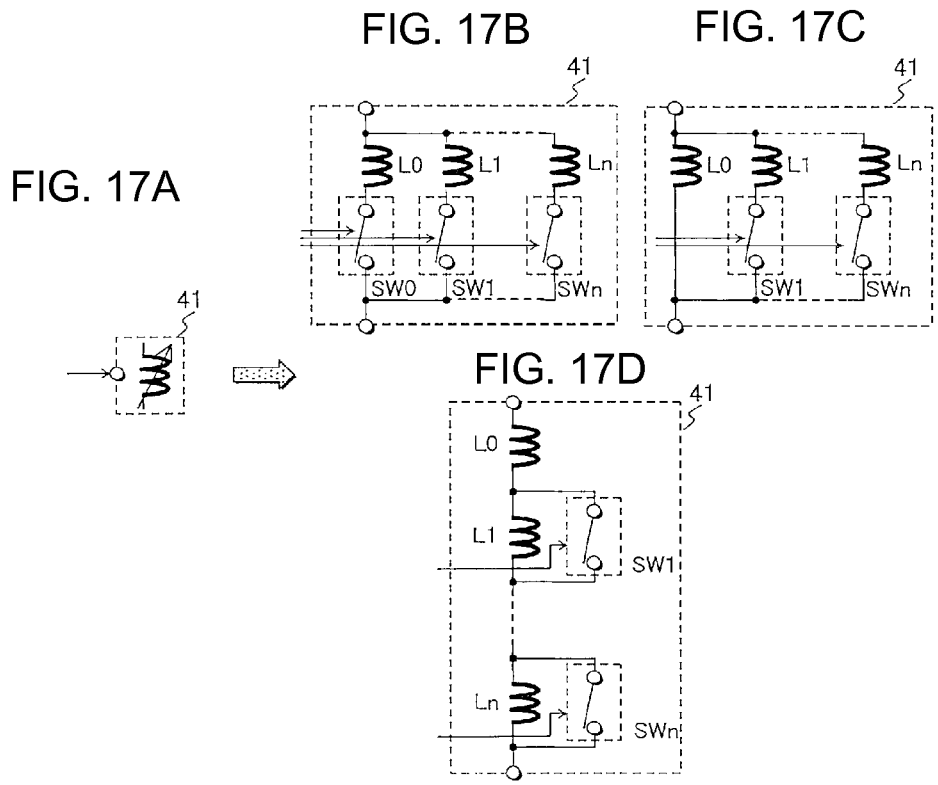
FIGS. 17A-17D illustrates configurations of various variable inductor circuits each of which can be used for a variable inductor circuit (L1) 41 in the power amplifier PA according to the fourth preferred embodiment of the present invention shown in any of FIGS. 9, 10, and 11.

FIGS. 17A-17C illustrate configurations of various variable inductor circuits each of which can be used for the variable inductor circuit (L1) 41 in the power amplifier PA according to the fourth preferred embodiment of the present invention shown in any of FIGS. 9, 10, and 11.

The variable inductor circuit 41 shown in FIG. 17A is specifically provided by a plurality of inductors L0, L1, ..., and Ln, and a plurality of switches SW0, SW1, ..., and SWn as shown in FIG. 17(B). The first inductor L0 and the first switch SW0 are preferably connected in series, the second inductor L1 and the second switch SW1 are preferably connected in series, and the last inductor Ln and the last switch SWn are preferably connected in series. The plural series-connected portions are preferably connected in parallel between two terminals of the variable inductor circuit 41. Each of the plurality of switches SW0, SW1, ..., and SWn can use any of the various switches shown in FIG. 15.

The variable inductor circuit 41 shown in FIG. 17A is specifically provided by a plurality of inductors L0, L1, ..., and Ln, and a plurality of switches SW1, ..., and SWn as shown in FIG. 17C. The first inductor L0 is preferably connected between two terminals of the variable inductor circuit 41. The second inductor L1 and the second switch SW1 are preferably connected in series, and the last inductor Ln and the last switch SWn are preferably connected in series. The plural series-connected portions are preferably connected in parallel between the two terminals of the variable inductor circuit 41. Each of the plurality of switches SW1, ..., and SWn can use any of the various switches shown in FIG. 15.

The variable inductor circuit 41 shown in FIG. 17A is specifically provided by a plurality of inductors L0, L1, ..., and Ln, and a plurality of switches SW1, ..., and SWn as shown in FIG. 17D. The first inductor L0, the second inductor L1, and the last inductor Ln are preferably connected in series between the two terminals of the variable inductor circuit 41. The second inductor L1 and the second switch SW1 are preferably connected in parallel, and the last inductor Ln and the last switch SWn are preferably connected in parallel. Each of the plurality of switches SW1, ..., and SWn can use any of the various switches shown in FIG. 15.

Fifth Preferred Embodiment

Figure 12:
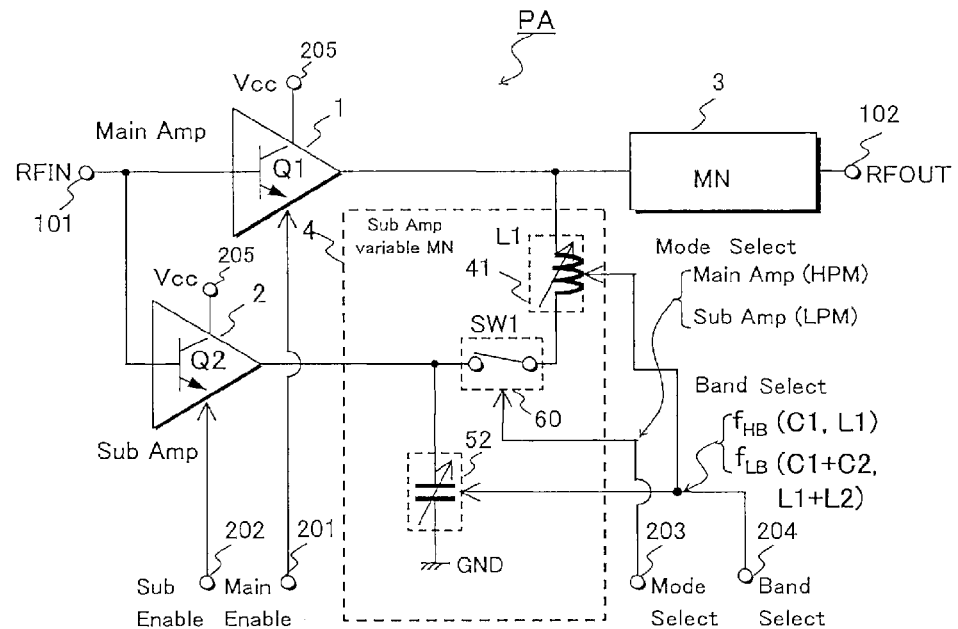
FIG. 12 illustrates a configuration of a power amplifier PA according to a fifth preferred embodiment of the present invention, to enable power amplification in a wide range from a low power state to a high power state and to increase power added efficiency when power of RF input signals having transmit frequencies in a plurality of frequency bands is amplified.

FIG. 12 illustrates a configuration of a power amplifier PA according to a fifth preferred embodiment of the present invention, to enable power amplification in a wide range from a low power state to a high power state and to increase power added efficiency when power of RF input signals having transmit frequencies in a plurality of frequency bands is amplified.

The power amplifier PA according to the fifth preferred embodiment of the present invention shown in FIG. 12 is preferably different from the power amplifier PA according to the fourth preferred embodiment of the present invention shown in FIG. 9 in the following point.

That is, the first capacitance C1 with the fixed capacitance value of about 6 pF in the power amplifier PA according to the fourth preferred embodiment of the present invention shown in FIG. 9 is preferably replaced with a variable capacitance circuit 52 in the power amplifier PA according to the fifth preferred embodiment of the present invention shown in FIG. 12.

Figure 13:
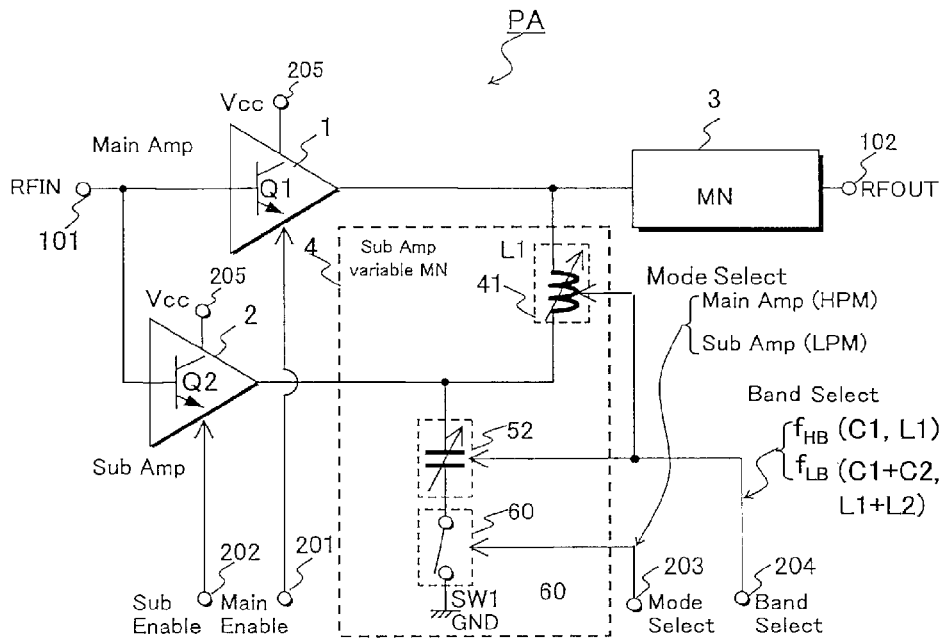
FIG. 13 illustrates a configuration of a power amplifier PA according to the fifth preferred embodiment of the present invention, to enable power amplification in a wide range from a low power state to a high power state and to increase power added efficiency when power of RF input signals having transmit frequencies in a plurality of frequency bands is amplified.

FIG. 13 illustrates a configuration of a power amplifier PA according to the fifth preferred embodiment of the present invention, to enable power amplification in a wide range from a low power state to a high power state and to increase power added efficiency when power of RF input signals having transmit frequencies in a plurality of frequency bands is amplified.

The power amplifier PA according to the fifth preferred embodiment of the present invention shown in FIG. 13 is preferably different from the power amplifier PA according to the fourth preferred embodiment of the present invention shown in FIG. 10 in the following point.

That is, the first capacitance C1 with the fixed capacitance value of about 6 pF in the power amplifier PA according to the fourth preferred embodiment of the present invention shown in FIG. 10 is preferably replaced with a variable capacitance circuit 52 in the power amplifier PA according to the fifth preferred embodiment of the present invention shown in FIG. 13.

Figure 14:
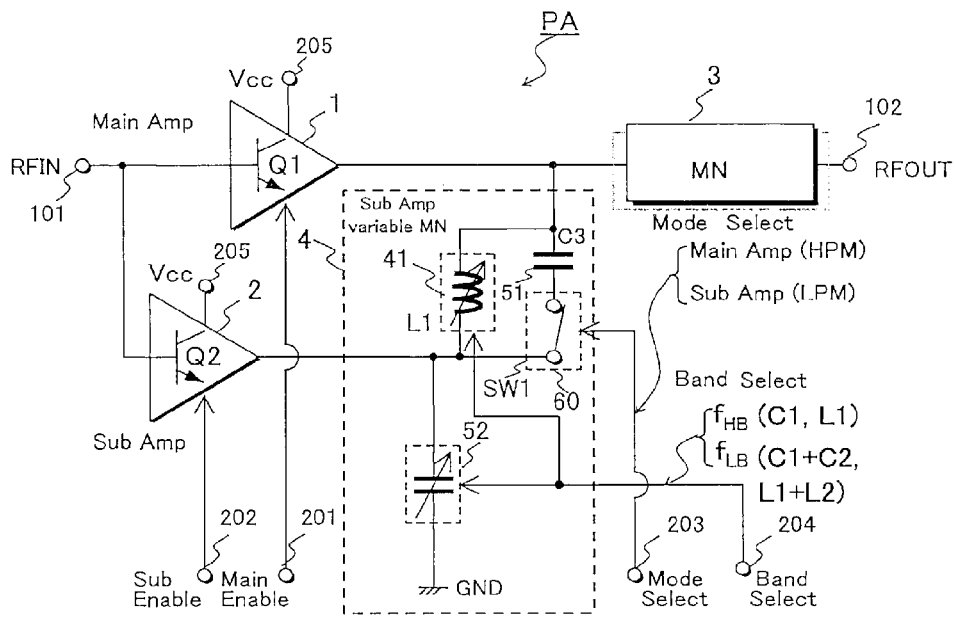
FIG. 14 illustrates a configuration of a power amplifier PA according to the fifth preferred embodiment of the present invention, to enable power amplification in a wide range from a low power state to a high power state and to increase power added efficiency when power of RF input signals having transmit frequencies in a plurality of frequency bands is amplified.

FIG. 14 illustrates a configuration of a power amplifier PA according to the fifth preferred embodiment of the present invention, to enable power amplification in a wide range from a low power state to a high power state and to increase power added efficiency when power of RF input signals having transmit frequencies in a plurality of frequency bands is amplified.

The power amplifier PA according to the fifth preferred embodiment of the present invention shown in FIG. 14 is preferably different from the power amplifier PA according to the fourth preferred embodiment of the present invention shown in FIG. 11 in the following point.

That is, the first capacitance C1 with the fixed capacitance value of about 6 pF in the power amplifier PA according to the fourth preferred embodiment of the present invention shown in FIG. 11 is preferably replaced with a variable capacitance circuit 52 in the power amplifier PA according to the fifth preferred embodiment of the present invention shown in FIG. 14.

If the second amplifier 2 executes an amplification operation in the power amplifier PA according to the fifth preferred embodiment of the present invention shown in any of FIGS. 12, 13, and 14, when the frequency band select signal that is supplied to the frequency band select terminal 204 selects the high-band transmit frequency $f_{HB}$, the capacitance value of the variable capacitance circuit 52 is determined by a first capacitance C1, and the inductance of the variable inductor circuit (L1) 41 is determined by a first inductor L1. Consequently, by using the first capacitance C1 and the first inductor L1, the destination obtained by the sum total of the moving amount ωL1 of the inductor L1 and the moving amount ωC1 of the capacitance C1 can be matched to the output impedance Zout_SA of the second amplifier 2.

If the second amplifier 2 executes an amplification operation in the power amplifier PA according to the fifth preferred embodiment of the present invention shown in any of FIGS. 12, 13, and 14, when the frequency band select signal that is supplied to the frequency band select terminal 204 selects the low-band transmit frequency $f_{LB}$, the capacitance value of the variable capacitance circuit 52 is determined by a parallel capacitance of the first capacitance C1 and a second capacitance C2, and the inductance of the variable inductor circuit (L1) 41 is determined by the total inductance of the first inductor L1 and a second inductor L2. Consequently, by using the parallel capacitance of the first capacitance C1 and the second capacitance C2 of the variable capacitance circuit 52 and the total inductance of the first inductor L1 and the second inductor L2 of the variable inductor circuit (L1) 41, the destination obtained by the sum total of the moving amount ω(L1+L2) of the total inductor L1+L2 and the moving amount ω(C1+C2) of the parallel capacitance (C1+C2) can be matched to the output impedance Zout_SA of the second amplifier 2.

With the power amplifier PA according to the fifth preferred embodiment of the present invention which has been described with reference to FIGS. 12, 13, and 14, the degree of freedom for setting the matching with the output impedance Zout_SA of the second amplifier 2 can be increased. Hence, even if the second amplifier 2 is provided by a transistor with a very small element size to exhibit high power added efficiency in a very low power state, and if the output impedance of the second amplifier 2 is increased to a very high value, good impedance matching can be realized between the output of the second amplifier 2 and the input of the second output matching circuit 4 by using the fifth preferred embodiment of the present invention.

Sixth Preferred Embodiment

FIG. 18 illustrates a configuration of a power amplifier PA according to a sixth preferred embodiment of the present invention, to enable power amplification in a wide range from a low power state to a high power state and to increase power added efficiency when power of RF input signals having transmit frequencies in a plurality of frequency bands is amplified.

First, the power amplifier PA according to the sixth preferred embodiment of the present invention shown in FIG. 18 preferably includes a high-band first amplifier 151H with a large element size, a high-band second amplifier 152H with a small element size, a high-band first output matching circuit 153H, and a high-band second output matching circuit 154H. High-band 3G input signals including Band 1, Band 2, and Band 4 of a WCDMA system are supplied to a first RF signal input terminal 101H. Each high-band 3G input signal is amplified by the high-band first amplifier 151H or the high-band second amplifier 152H. Hence, high-band 3G output signals including Band 1, Band 2, and Band 4 of the WCDMA system are generated from a first RF signal output terminal 102H. Transmit frequencies of Band 1 of the WCDMA system are in a range from about 1920 MHz to about 1980 MHz. Transmit frequencies of Band 2 of the WCDMA system are in a range from about 1850 MHz to about 1910 MHz. Transmit frequencies of Band 4 of the WCDMA system are in a range from about 1710 MHz to about 1755 MHz. Also, the high-band first amplifier 151H, the high-band second amplifier 152H, the high-band first output matching circuit 153H, and the high-band second output matching circuit 154H shown in FIG. 18 are configured and operated similarly to the first amplifier 1, the second amplifier 2, the first output matching circuit 3, and the second output matching circuit 4 included in the power amplifier PA according to the first preferred embodiment of the present invention shown in FIG. 1.

The power amplifier PA according to the sixth preferred embodiment of the present invention shown in FIG. 18 preferably includes a low-band first amplifier 151L with a large element size, a low-band second amplifier 152L with a small element size, a low-band first output matching circuit 153L, and a low-band second output matching circuit 154L. Low-band 3G input signals including Band 5 and Band 8 of the WCDMA system are supplied to a second RF signal input terminal 101L. Each low-band 3G input signal is amplified by the low-band first amplifier 151L or the low-band second amplifier 152L. Hence, low-band 3G output signals including Band 5 and Band 8 of the WCDMA system are generated from a second RF signal output terminal 102L. As described above, transmit frequencies of Band 5 of the WCDMA system are in a range from about 824 MHz to about 849 MHz, and transmit frequencies of Band 8 of the WCDMA system are in a range from about 880 MHz to about 915 MHz. Also, the low-band first amplifier 151L, the low-band second amplifier 152L, the low-band first output matching circuit 153L, and the low-band second output matching circuit 154L shown in FIG. 18 are configured and operated similarly to the first amplifier 1, the second amplifier 2, the first output matching circuit 3, and the second output matching circuit 4 included in the power amplifier PA according to the first preferred embodiment of the present invention shown in FIG. 1.

In addition, the power amplifier PA according to the sixth preferred embodiment of the present invention shown in FIG. 18 preferably includes a bias matching control circuit 150. An enable signal ENA, a mode signal MODE, a first band select signal BS1, a second band select signal BS2, and a third band select signal BS3 are preferably supplied to the bias matching control circuit 150 from one of an RF signal processing semiconductor integrated circuit and a base band processor mounted on a cellular phone terminal.

Main Bias as a high-band first amplifier enable signal and Sub Bias as a high-band second amplifier enable signal are generated from the bias matching control circuit 150, and are preferably supplied to the high-band first amplifier 151H and the high-band second amplifier 152H, respectively. Further, a Main Bias as a low-band first amplifier enable signal and a Sub Bias as a low-band second amplifier enable signal are generated from the bias matching control circuit 150, and are preferably supplied to the low-band first amplifier 151L and the low-band second amplifier 152L, respectively.

The bias matching control circuit 150 supplies a mode signal MODE, a select signal B1 for Band 1 of the WCDMA system, a select signal B2 for Band 2 of the WCDMA system, and a select signal B4 for Band 4 of the WCDMA system to the high-band second output matching circuit 154H.

The bias matching control circuit 150 supplies a mode signal MODE, a select signal B5 for Band 5 of the WCDMA system, and a select signal B8 for Band 8 of the WCDMA system to the low-band second output matching circuit 154L.

FIG. 19 is a table explaining an operation of the power amplifier PA according to the sixth preferred embodiment of the present invention shown in FIG. 18.

In the first row of FIG. 19, a column for Band, a column for Power Mode, a column for enable signal ENA, a column for mode signal MODE, a column for first band select signal BS1, a column for second band select signal BS2, and a column for third band select signal BS3 are arranged from left to right.

The Band (frequency band) in the leftmost column in FIG. 19 includes Low Band and High Band. The Low Band includes Band 5 and Band 8 of the WCDMA system. The High Band includes Band 1, Band 2, and Band 4 of the WCDMA system.

The Power Mode in the second column from left in FIG. 19 includes High Power that represents a high power mode HPM, and Low Power that represents a low power mode LPM.

The enable signal ENA in the third column from left in FIG. 19 includes high level "H." Hence, the power amplifier PA according to the sixth preferred embodiment of the present invention shown in FIG. 18 is set in an operation enabled state in any operation state shown in FIG. 19.

The mode signal MODE in the fourth column from left in FIG. 19 includes high level "H" (corresponding to high power) and low level "L" (corresponding to low power).

The first band select signal BS1 in the fifth column from left in FIG. 19 includes low level "L" (corresponding to Low Band) and high level "H" (corresponding to High Band).

The second band select signal BS2 in the sixth column from left and the third band select signal BS3 in the rightmost column in FIG. 19 include high level "H" and low level "L." Two bits of the second band select signal BS2 and the third band select signal BS3 are used in setting the frequency characteristics of the high-band second output matching circuit 154H and the low-band second output matching circuit 154L.

In response to the enable signal ENA of high level "H" that is supplied to the bias matching control circuit 150, the power amplifier PA according to the sixth preferred embodiment of the present invention shown in FIG. 18 is set in the operation enabled state.

If the mode signal MODE that is supplied to the bias matching control circuit 150 is high level "H" (corresponding to high power), the Main Bias of a high-band first amplifier enable signal activates the high-band first amplifier 151H, and the Sub Bias of a high-band second amplifier disenable signal deactivates the high-band second amplifier 152H. Also, since the first switch (SW1) 60 in the high-band second output matching circuit 154H is controlled, the effect of the high-band second output matching circuit 154H to an output terminal of the high-band first amplifier 151H is reduced. Further, in this case, the Main Bias of a low-band first amplifier enable signal activates the low-band first amplifier 151L, and the Sub Bias of a low-band second amplifier disenable signal deactivates the low-band second amplifier 152L. Also, since the first switch (SW1) 60 in the low-band second output matching circuit 154L is controlled, the effect of the low-band second output matching circuit 154L to an output terminal of the low-band first amplifier 151L is reduced.

If the mode signal MODE that is supplied to the bias matching control circuit 150 is low level "L" (corresponding to low power), the Main Bias of the high-band first amplifier disenable signal deactivates the high-band first amplifier 151H, and the Sub Bias of the high-band second amplifier enable signal activates the high-band second amplifier 152H. Further, the RF amplified output signal from an output terminal of the high-band second amplifier 152H can be supplied to an input terminal of the high-band first output matching circuit 153H through the RF signal path between an input terminal and an output terminal of the high-band second output matching circuit 154H. Further, in this case, the Main Bias of the low-band first amplifier disenable signal deactivates the low-band first amplifier 151L, and the Sub Bias of the low-band second amplifier enable signal activates the low-band second amplifier 152L. Further, the RF amplified output signal from an output terminal of the low-band second amplifier 152L can be supplied to an input terminal of the low-band first output matching circuit 153L through the RF signal path between an input terminal and an output terminal of the low-band second output matching circuit 154L.

If one bit of the first band select signal BS1 that is supplied to the bias matching control circuit 150 is low level "L" (corresponding to Low Band), the low-band first amplifier 151L, the low-band second amplifier 152L, the low-band first output matching circuit 153L, and the low-band second output matching circuit 154L arranged to amplify low-band 3G input signals including Band 5 and Band 8 of the WCDMA system supplied to the second RF signal input terminal 101L are activated.

If one bit of the first band select signal BS1 that is supplied to the bias matching control circuit 150 is high level "H" (corresponding to High Band), the high-band first amplifier 151H, the high-band second amplifier 152H, the high-band first output matching circuit 153H, and the high-band second output matching circuit 154H arranged to amplify high-band 3G input signals including Band 1, Band 2, and Band 4 of the WCDMA system supplied to the first RF signal input terminal 101H are activated.

If one bit of the first band select signal BS1 that is supplied to the bias matching control circuit 150 is low level "L" (corresponding to Low Band), two bits of the second band select signal BS2 and the third band select signal BS3 set the frequency characteristic of the low-band second output matching circuit 154L as follows.

That is, one bit of the third band select signal BS3 has no relation. If one bit of the second band select signal BS2 is high level "H," the frequency characteristic of the low-band second output matching circuit 154L is optimized for the transmit frequencies in the range from about 824 MHz to about 849 MHz of Band 5 of the WCDMA system at a low-frequency side. More specifically, for example, the capacitance value of the variable capacitance circuit 52 of the low-band second output matching circuit 154L is determined by the parallel capacitance C1+C2 of the first capacitance C1 and the second capacitance C2, or the inductance of the variable inductor circuit (L1) 41 of the low-band second output matching circuit 154L is determined by the total inductance L1+L2 of the first inductor L1 and the second inductor L2.

Also, if one bit of the second band select signal BS2 is low level "L," the frequency characteristic of the low-band second output matching circuit 154L is optimized for the transmit frequencies in the range from about 880 MHz to about 915 MHz of Band 8 of the WCDMA system at a high-frequency side. More specifically, for example, the capacitance value of the variable capacitance circuit 52 of the low-band second output matching circuit 154L is determined by only the capacitance C1 of the first capacitance C1, or the inductance of the variable inductor circuit (L1) 41 of the low-band second output matching circuit 154L is determined by only the inductance L1 of the first inductance L1.

If one bit of the first band select signal BS1 that is supplied to the bias matching control circuit 150 is high level "H" (corresponding to High Band), two bits of the second band select signal BS2 and the third band select signal BS3 set the frequency characteristic of the high-band second output matching circuit 154H as follows.

That is, if the second band select signal BS2 is low level "L" and the third band select signal BS3 is low level "L," the frequency characteristic of the high-band second output matching circuit 154H is optimized for the transmit frequencies in the range from about 1920 to about 1980 MHz of Band 1 of the WCDMA system with high frequencies. More specifically, for example, the capacitance value of the variable capacitance circuit 52 of the high-band second output matching circuit 154H is set at a minimum capacitance $C_S$, or the inductance of the variable inductor circuit (L1) 41 of the high-band second output matching circuit 154H is set at a minimum inductance $L_S$.

If the second band select signal BS2 is high level "H" and the third band select signal BS3 is low level "L," the frequency characteristic of the high-band second output matching circuit 154H is optimized for the transmit frequencies in the range from about 1850 MHz to about 1910 MHz of Band 2 of the WCDMA system with medium frequencies. More specifically, for example, the capacitance value of the variable capacitance circuit 52 of the high-band second output matching circuit 154H is preferably set at a medium capacitance $C_M$ that is larger than the minimum capacitance $C_S$, or the inductance of the variable inductor circuit (L1) 41 of the high-band second output matching circuit 154H is preferably set at a medium inductance $L_M$ that is larger than the minimum inductance $L_S$.

Last, if the second band select signal BS2 is high level "H" and the third band select signal BS3 is high level "H," the frequency characteristic of the high-band second output matching circuit 154H is optimized for the transmit frequencies in the range from about 1710 MHz to about 1755 MHz of Band 4 of the WCDMA system with low frequencies. More specifically, for example, the capacitance value of the variable capacitance circuit 52 of the high-band second output matching circuit 154H is preferably set at a maximum capacitance $C_L$ that is larger than the medium capacitance $C_M$, or the inductance of the variable inductor circuit (L1) 41 of the high-band second output matching circuit 154H is preferably set at a maximum inductance $L_L$ that is larger than the medium inductance $L_M$.

With the power amplifier PA according to the sixth preferred embodiment of the present invention which has been described above with reference to FIGS. 18 and 19, in multi-band of Band 1, Band 2, Band 4, Band 5, and Band 8 of the WCDMA system, high power added efficiency can preferably be realized with a transmit operation in a wire range from the low power mode LPM to the high power mode HPM.

Seventh Preferred Embodiment

FIG. 20 illustrates a configuration of a power amplifier PA according to a seventh preferred embodiment of the present invention, to enable power amplification in a wide range from a low power state to a high power state and to increase power added efficiency when power of RF input signals having transmit frequencies in a plurality of frequency bands is amplified.

First, the power amplifier PA according to the seventh preferred embodiment of the present invention shown in FIG. 20 preferably includes the high-band first amplifier 151H, the high-band second amplifier 152H, the high-band first output matching circuit 153H, the high-band second output matching circuit 154H, the low-band first amplifier 151L, the low-band second amplifier 152L, the low-band first output matching circuit 153L, the low-band second output matching circuit 154L, and the bias matching control circuit 150, which are included in the power amplifier PA according to the sixth preferred embodiment of the present invention shown in FIG. 18.

Hence, the power amplifier PA according to the seventh preferred embodiment of the present invention shown in FIG. 20 is arranged to amplify high-band 3G input signals including Band 1, Band 2, and Band 4 of the WCDMA system to be supplied to the first RF signal input terminal 101H, and low-band 3G input signals including Band 5 and Band 8 of the WCDMA system to be supplied to the second RF signal input terminal 101L, similarly to the power amplifier PA according to the sixth preferred embodiment of the present invention shown in FIG. 18.

The power amplifier PA according to the seventh preferred embodiment of the present invention shown in FIG. 20 preferably further includes a logic decoder circuit 170, a control circuit 171, a high-band third amplifier 172H, a high-band third output matching circuit 173H, a high-band output detector 174H, a low-band third amplifier 172L, a low-band third output matching circuit 173L, and a low-band output detector 174L.

High-band 2G input signals including DCS1800 and PCS1900 of GSM system are supplied to a third RF signal input terminal 175H. Hence, the high-band 2G input signals are amplified by the high-band third amplifier 172H. Amplified output signals from the high-band third amplifier 172H are preferably transmitted to a third RF signal output terminal 176H through the high-band third output matching circuit 173H and the high-band output detector 174H. Hence, high-band 2G output signals including DCS1800 and PCS1900 of the GSM system are generated from the third RF signal output terminal 176H. GSM stands for global system for mobile communication. DCS stands for digital cellar system. PCS stands for personal communication system. Transmit frequencies of DCS1800 are in a range from about 1710 MHz to about 1785 MHz. Transmit frequencies of PCS1900 are in a range from about 1850 MHz to about 1910 MHz.

Low-band 2G input signals including GSM850 and GSM900 of the GSM system are supplied to a fourth RF signal input terminal 175L. Hence, the low-band input signals 2G are amplified by the low-band third amplifier 172L. Amplified output signals from the low-band third amplifier 172L are transmitted to a fourth RF signal output terminal 176L through the low-band third output matching circuit 173L and the low-band output detector 174L. Hence, low-band 2G output signals including GSM850 and GSM900 of the GSM system are generated from the fourth RF signal output terminal 176L. Transmit frequencies of GSM850 are in a range from about 824 MHz to about 849 MHz. Transmit frequencies of GSM900 are in a range from about 880 MHz to about 915 MHz.

The high-band output detector 174H is provided by, for example, a directional coupler. Hence, the high-band output detector 174H is arranged to generate a first detection voltage VdetH that is proportional to a transmit power level of an amplified output signal of the high-band third amplifier 172H, the signal which has passed through the high-band third output matching circuit 173H.

The first detection voltage VdetH from the high-band output detector 174H is preferably supplied to a detector circuit 1713 in the control circuit 171. A ramp voltage VRAMP is supplied to one of input terminals of an error amplifier 1711 in the control circuit 171, and a detected output voltage of the detector circuit 1713 is supplied to the other input terminal of the error amplifier 1711.

An output signal of the error amplifier 1711 is preferably supplied to a bias control circuit 1712 in the control circuit 171, and a bias voltage Bias is supplied from the bias control circuit 1712 to the high-band third amplifier 172H. An amplification gain of the high-band third amplifier 172H is set by the bias voltage Bias. Consequently, the amplification gain of the high-band third amplifier 172H is set so that the voltage level of the ramp voltage VRAMP supplied to the one input terminal of the error amplifier 1711 is matched to the detected output voltage of the detector circuit 1713 supplied to the other input terminal of the error amplifier 1711.

The low-band output detector 174L is preferably provided by, for example, a directional coupler. Hence, the low-band output detector 174L generates a second detection voltage VdetL that is proportional to a transmit power level of an amplified output signal of the low-band third amplifier 172L, the signal which has passed through the low-band third output matching circuit 173L.

The second detection voltage VdetL from the low-band output detector 174L is supplied to the detector circuit 1713 in the control circuit 171. The ramp voltage VRAMP is supplied to the one input terminal of the error amplifier 1711 in the control circuit 171, and a detected output voltage of the detector circuit 1713 is supplied to the other input terminal of the error amplifier 1711.

The output signal of the error amplifier 1711 is supplied to the bias control circuit 1712 in the control circuit 171, and the bias voltage Bias is supplied from the bias control circuit 1712 to the low-band third amplifier 172L. The amplification gain of the low-band third amplifier 172L is set by the bias voltage Bias. Consequently, the amplification gain of the low-band third amplifier 172L is set so that the voltage level of the ramp voltage VRAMP supplied to the one input terminal of the error amplifier 1711 is matched to the detected output voltage of the detector circuit 1713 supplied to the other input terminal of the error amplifier 1711.

If the high-band 2G input signal of DCS1800 or PCS1900 of the GSM system supplied to the third RF signal input terminal 175H includes only a phase modulation component of GMSK system, the ramp voltage VRAMP that is supplied to the one input terminal of the error amplifier 1711 is preferably used for ramp-up and ramp-down at the transmission slot of time divisional multiple access (TDMA) of the GSM system. GMSK stands for Gaussian minimum shift keying.

Similarly, if the low-band 2G input signal of GSM850 or GSM900 of the GSM system supplied to the fourth RF signal input terminal 175L includes only a phase modulation component of the GMSK system, the ramp voltage VRAMP that is supplied to the one input terminal of the error amplifier 1711 is preferably used for ramp-up and ramp-down at the transmission slot of time divisional multiple access (TDMA) of the GSM system.

If the high-band 2G input signal of DCS1800 or PCS1900 of the GSM system supplied to the third RF signal input terminal 175H includes a phase modulation component of the GMSK system and an amplitude modulation component of EDGE system, the ramp voltage VRAMP that is supplied to the one input terminal of the error amplifier 1711 is preferably used for ramp-up and ramp-down at the transmission slot of time divisional multiple access (TDMA) of the GSM system, and also preferably used for bias control of amplitude modulation of the EDGE system.

Similarly, if the low-band 2G input signal of GSM850 or GSM900 of the GSM system supplied to the fourth RF signal input terminal 175L includes a phase modulation component of the GMSK system and an amplitude modulation component of the EDGE system, the ramp voltage VRAMP that is supplied to the one input terminals of the error amplifier 1711 is preferably used for ramp-up and ramp-down at the transmission slot of time divisional multiple access (TDMA) of the GSM system, and also preferably used for bias control of amplitude modulation of the EDGE system.

Meanwhile, the logic decoder circuit 170 in FIG. 20 is supplied with an enable signal ENA, a band select signal BS, a G-mode signal GMODE, a first W-mode signal WMODE1, a second W-mode signal WMODE2, and a ramp voltage VRAMP from one of the RF signal processing semiconductor integrated circuit and the base band processor mounted on the cellular phone terminal. The logic decoder circuit 170 decodes these signals, and generates control signals. The control signals generated from the logic decoder circuit 170 control an inside operation of the power amplifier PA according to the seventh preferred embodiment of the present invention shown in FIG. 20.

The band select signal BS in FIG. 20 corresponds to the first band select signal BS1 in FIG. 18. The G-mode signal GMODE in FIG. 20 also corresponds to the second band select signal BS2 in FIG. 18. Further, the ramp voltage VRAMP in FIG. 20 also corresponds to the third band select signal BS3. Further, the first W-mode signal WMODE1 and the second W-mode WMODE2 in FIG. 20 are preferably extended signals of the mode signal MODE in FIG. 18.

FIG. 21 is a table explaining an operation of the power amplifier PA according to the seventh preferred embodiment of the present invention shown in FIG. 20.

In the first row of FIG. 21, a column for Mode, a column for Band, a column for Power Mode, a column for enable signal ENA, a column for band select signal BS (corresponding to the first band select signal BS1), a column for G-mode signal GMODE (corresponding to the second band select signal BS2), a column for ramp voltage VRAMP (corresponding to third band select signal BS3), a column for first W-mode signal WMODE1, and a column for second W-mode signal WMODE2 are arranged from left to right.

The Mode in the leftmost column in FIG. 21 includes GMSK system, EDGE system, and WCDMA system.

In the second column from left in FIG. 21, the Band of the GMSK system includes Low Band and High Band, the Band of the EDGE system includes Low Band and High Band, and the Band of the WCDMA system includes Low Band and High Band. The Low Band of the WCDMA system includes Band 5 and Band 8 of the WCDMA system. The High Band of the WCDMA system includes Band 1, Band 2, and Band 4 of the WCDMA system.

The third column from left in FIG. 21 for the Power Mode indicates that the Power Mode is not used in the GMSK system or the EDGE system. The Power mode of the WCDMA system includes High Power that represents a high power mode HPM, Medium Power that represents a medium power mode MPM, and Low Power that represents a low power mode LPM.

The enable signal ENA in the fourth column from left in FIG. 21 includes high level "H." Hence, the power amplifier PA according to the seventh preferred embodiment of the present invention shown in FIG. 20 is set in an operation enabled state in any operation state shown in FIG. 21.

The band select signal BS (corresponding to the first band select signal BS1) in the fifth column from left in FIG. 21 includes low level "L" (corresponding to Low Band) and high level "H" (corresponding to High Band) like the first band select signal BS1 in the fifth column from left in FIG. 19.

The sixth column from left in FIG. 21 for the G-mode signal GMODE (corresponding to the second band select signal BS2) indicates that the GMSK system employs GMSK system at high level "H" and the EDGE system uses EDGE system at low level "L." Also, the WCDMA system in this column includes high level "H" and low level "L" like the second band select signal BS2 in the sixth column from left in FIG. 19.

The seventh column from left in FIG. 21 for the ramp voltage VRAMP indicates that the ramp voltage VRAMP in the GMSK system is used for ramping (i.e., ramp-up and ramp-down at the transmission slot of time divisional multiple access (TDMA) of the GSM system). Also, this column includes a symbol * for the EDGE system. The symbol * indicates that the ramp voltage VRAMP is used for the ramping of the GMSK system and for the bias control for the amplitude modification of the EDGE system. Also, the WCDMA system in this column includes high level "H" and low level "L" like the third band select signal BS3 in the rightmost column in FIG. 19.

That is, two bits of the second band select signal BS2 and the third band select signal BS3 of the WCDMA system in the sixth column from left for the G-mode signal GMODE and in the seventh column from left for the ramp voltage VRAMP in FIG. 21 are used to set the frequency characteristic of the high-band second output matching circuit 154H and the frequency characteristic of the low-band second output matching circuit 154L.

Two bits of the first W-mode signal WMODE1 in the eighth column from left and the second W-mode signal WMODE2 in the rightmost column in FIG. 21 indicate a Power Mode of the WCDMA system in the third column from left in FIG. 21. Hence, in these two columns, the two bits of the GMSK system and the two bits of the EDGE system indicate that the Power Mode is not employed ("LL"). Meanwhile, in these two columns, two bits of the WCDMA system indicate High Power by combination of "HL," Medium Power by combination of "LH," and Low Power by combination of "HH."

In the power amplifier PA according to the seventh preferred embodiment of the present invention shown in FIG. 20, for example, the state of the high-band first amplifier 151H and the low-band first amplifier 151L including the transistors Q1 with the large element sizes is switched from the active state to the non-active state, and the state of the high-band second amplifier 152H and the low-band second amplifier 152L including the transistors Q2 with the small element sizes is switched from the non-active state to the active state, by switching the power from the High Power to the Medium Power in the operation of the WCDMA system. Further, by switching the power from the Medium Power to the Low Power, the operating rates of the transistors Q2 with the small element sizes of the high-band second amplifier 152H and the low-band second amplifier 152L are each preferably decreased to about 50%. In general, a power transistor of a power amplifier is provided by a plurality of parallel-connected unit transistors. Hence, by decreasing the parallel-connected plural unit transistors of the transistors Q2 with the small element sizes to be halved or substantially halved, the operating rates of the transistor Q2 with the small element sizes can be easily decreased to about 50%. Consequently, the power added efficiency (PAE) of the power amplifier PA according to the seventh preferred embodiment of the present invention shown in FIG. 20 can be further improved in the operation with the Low Power.

The switching of the amplifier from the first amplifier 1 to the second amplifier 2 in response to a decrease in transmit power of the power amplifier PA, and the matching of the second output matching circuit 4 that is required for the switching in accordance with the high frequency and the low frequency have been described in detail in the first to sixth preferred embodiments of the present invention.

The power amplifier PA according to the seventh preferred embodiment of the present invention described with reference to FIGS. 20 and 21 also uses this principle of operation.

That is, the state of the high-band first amplifier 151H and the low-band first amplifier 151L including the transistors Q1 with the large element sizes is switched from the active state to the non-active state, and the state of the high-band second amplifier 152H and the low-band second amplifier 152L including the transistors Q2 with the small element sizes is switched from the non-active state to the active state, by switching the power from the High Power to the Medium Power in the operation of the WCDMA system. Accordingly, the power added efficiency (PAE) of the power amplifier PA with the Medium Power can be improved.

Further, by using the two bits of the second band select signal BS2 and the third band select signal BS3 of the WCDMA system in the sixth column from left for the G-mode signal GMODE and in the seventh column from left for the ramp voltage VRAMP in FIG. 21, the frequency characteristic of the high-band second output matching circuit 154H and the frequency characteristic of the low-band second output matching circuit 154L are matched to the multi-band of Band 1, Band 2, Band 4, Band 5, and Band 8 of the WCDMA system.

Further, with the power amplifier PA according to the seventh preferred embodiment of the present invention explained with reference to FIGS. 20 and 21, an external terminal of the G-mode signal GMODE and an external terminal of the ramp voltage VRAMP can be also used for an input for the second band select signal BS2 and an input for the third band select signal BS3. Consequently, the number of external terminals of the power amplifier PA can be decreased, and the cost of the power amplifier PA can be reduced.

Other Preferred Embodiments

The various preferred embodiments of the present invention made by the inventors have been described above in detail. However, the present invention is not limited to the preferred embodiments, and of course, the present invention can be modified in various ways within the scope of the invention.

For example, in the power amplifier PA according to the seventh preferred embodiment of the present invention shown in FIG. 20, for another example, the state of the high-band first amplifier 151H and the low-band first amplifier 151L including the transistors Q1 with the large element sizes is switched from the active state to the non-active state, and the state of the high-band second amplifier 152H and the low-band second amplifier 152L including the transistors Q2 with the small element sizes is switched from the non-active state to the active state, by switching the power from the Medium Power to the Low Power in the operation of the WCDMA system. Further, by switching the power from the Medium Power to the High Power, the operating rates of the transistors Q1 with the large element sizes of the high-band first amplifier 151H and the low-band first amplifier 151L are increased to about 200%. That is, the auxiliary transistor Q1 with the large element size is in a standby state, and by switching the power from the Medium Power to the High Power, the amplification operation of the auxiliary transistor Q1 in the standby state is started. Consequently, the power added efficiency (PAE) of the power amplifier PA according to the seventh preferred embodiment of the present invention shown in FIG. 20 can be further improved in the operation with the High Power.

Further, in the power amplifier PA according to the sixth preferred embodiment of the present invention shown in FIG. 18, the high-band output detector 174H and the low-band output detector 174L are preferably provided by the directional couplers. Alternatively, the high-band output detector 174H and the low-band output detector 174L can include current-sense-type output detectors. A current-sense-type output detector is a type in which a detection transistor with a small element size is preferably connected in parallel to an output transistor of a power amplifier and small detection AD/DC operating current, which is proportional to AD/DC operating current of the output transistor, is applied to the AC/DC operating current.

Further, the transistor Q1 and Q2 of the power amplifier PA of various preferred embodiments of the present invention do not have to be the hetero-junction bipolar transistor (HBT) and the LD-type MOS transistor, and can use a N-channel field effect transistor of MESFET or HEMT of a compound semiconductor made of, for example, GaAs or InP.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power amplifier comprising:
an RF signal input terminal;
a first amplifier;
a second amplifier;
a first output matching circuit;
a second output matching circuit; and
an RF signal output terminal; wherein
the first amplifier includes a first transistor with a large element size to exhibit high power added efficiency in a high power state and a second transistor with a smaller element size than the element size of the first transistor to exhibit high power added efficiency in a low power state;
an input terminal of the first amplifier and an input terminal of the second amplifier are commonly connected to the RF signal input terminal, and an RF input signal that is supplied to the RF signal input terminal is amplified by the first amplifier and the second amplifier;
an output terminal of the first amplifier is connected to an input terminal of the first output matching circuit, and an output terminal of the second amplifier is connected to an input terminal of the second output matching circuit;
an output terminal of the second output matching circuit is connected to the input terminal of the first output matching circuit and an output terminal of the first output matching circuit is connected to the RF signal output terminal;
an inductive reactance is connected between the output terminal of the second output matching circuit and the input terminal of the second output matching circuit, and a capacitive reactance is connected between the input terminal of the second output matching circuit and a ground voltage;
if the power amplifier executes power amplification in the high power state, the RF input signal is amplified by the first amplifier, and a first RF amplified output signal of the first amplifier is output to the RF signal output terminal through the first output matching circuit;
the RF input signal is amplified by the second amplifier if the power amplifier executes power amplification in the low power state and a second RF amplified output signal of the second amplifier is output to the RF signal output terminal through the second output matching circuit and the first output matching circuit;
the inductive reactance and the capacitive reactance of the second output matching circuit are set at respective predetermined values if the power amplifier executes the power amplification in the low power state and the RF input signal having a first frequency is amplified by the second amplifier; and
at least one reactance of the inductive reactance and the capacitive reactance of the second output matching circuit is set at a larger value than the predetermined value if the power amplifier executes the power amplification in the low power state and the RF input signal having a second frequency that is lower than the first frequency is amplified by the second amplifier.

2. The power amplifier according to claim 1, wherein
the capacitive reactance is set at a predetermined capacitance value if the power amplifier executes the power amplification in the low power state and the RF input signal having the first frequency is amplified by the second amplifier; and
the capacitive reactance is set at a larger capacitance value than the predetermined capacitance value if the power amplifier executes the power amplification in the low power state and the RF input signal having the second frequency is amplified by the second amplifier.

3. The power amplifier according to claim 1, wherein
the inductive reactance is set at a predetermined inductor value if the power amplifier executes the power amplification in the low power state and the RF input signal having the first frequency is amplified by the second amplifier; and
the inductive reactance is set at a larger inductor value than the predetermined inductor value if the power amplifier executes the power amplification in the low power state and the RF input signal having the second frequency is amplified by the second amplifier.

4. The power amplifier according to claim 1, wherein
the second output matching circuit is supplied with a frequency band select signal;
the inductive reactance and the capacitive reactance of the second output matching circuit are set at the predetermined values if the frequency band select signal is in a first state; and
the one reactance of the second output matching circuit is set at the larger value if the frequency band select signal is in a second state that is different from the first state.

5. The power amplifier according to claim 4, wherein
the second output matching circuit includes a first switch that is supplied with a mode select signal;
the first switch is controlled to be in one of an ON state and an OFF state if the mode select signal indicates the high power state such that an effect of the second output matching circuit to the output terminal of the first amplifier is reduced; and
the first switch is controlled to be in the other of the ON state and the OFF state if the mode select signal indicates the low power state such that the second RF amplified output signal of the second amplifier is supplied to the input terminal of the first output matching circuit through the second output matching circuit including the first switch controlled to be in the other.

6. The power amplifier according to claim 5, wherein
the first amplifier is controlled to be in an active state and the second amplifier is controlled to be in a non-active state if the power amplifier executes the power amplification in the high power state; and
the first amplifier is controlled to be in a non-active state and the second amplifier is controlled to be in an active state if the power amplifier executes the power amplification in the low power state.

7. The power amplifier according to claim 6, wherein
the one reactance includes a second switch that is supplied with the frequency band select signal;
if the frequency band select signal is in the first state, the second switch is controlled to be in one of an ON state and an OFF state, and the second switch so controlled is arranged to set the inductive reactance and the capacitive reactance of the second output matching circuit at the respective predetermined values; and
if the frequency band select signal is in the second state, the second switch is controlled to be in the other of the ON state and the OFF state, and the second switch so controlled is arranged to set the one reactance of the second output matching circuit at the larger value.

8. The power amplifier according to claim 7, wherein
the inductive reactance and the first switch are connected in series between the input terminal of the second output matching circuit and the output terminal of the second output matching circuit;
the capacitive reactance includes a first capacitance and a second capacitance; and
one end of the first capacitance and one end of the second capacitance are connected to the input terminal of the second output matching circuit, the other end of the first capacitance is connected to the ground voltage, and the other end of the second capacitance is connected to the ground voltage through the second switch.

9. The power amplifier according to claim 7, wherein
the capacitive reactance includes a first capacitance and a second capacitance; and
one end of the first capacitance and one end of the second capacitance are connected to the input terminal of the second output matching circuit, the other end of the first capacitance is connected to the ground voltage through the first switch, and the other end of the second capacitance is connected to the ground voltage through the second switch.

10. The power amplifier according to claim 7, wherein
the second output matching circuit includes another capacitance;
the series-connected first switch and the another capacitance are connected in parallel to the inductive reactance between the input terminal of the second output matching circuit and the output terminal of the second output matching circuit;
the first switch is controlled to be in the ON state if the mode select signal indicates the high power state so as to provide a parallel resonance circuit of the other capacitance and the inductive reactance, and the effect of the second output matching circuit to the output terminal of the first amplifier is reduced; and
the first switch is controlled to be in the OFF state if the mode select signal indicates the low power state so as to provide the second RF amplified output signal of the second amplifier to the input terminal of the first output matching circuit through the second output matching circuit including the first switch controlled to be in the OFF state.

11. The power amplifier according to claim 7, wherein
the RF signal input terminal includes a high-band RF signal input terminal and a low-band RF signal input terminal;
the RF signal output terminal includes a high-band RF signal output terminal and a low-band RF signal output terminal;
the first amplifier includes a high-band first amplifier and a low-band first amplifier;
the second amplifier includes a high-band second amplifier and a low-band second amplifier;
the first output matching circuit includes a high-band first output matching circuit and a low-band first output matching circuit;
the second output matching circuit includes a high-band second output matching circuit and a low-band second output matching circuit;
the high-band first amplifier, the high-band second amplifier, the high-band first output matching circuit, and the high-band second output matching circuit are arranged to amplify a high-band RF input signal that is supplied to the high-band RF signal input terminal and to output a high-band RF amplified signal to the high-band RF signal output terminal;
the low-band first amplifier, the low-band second amplifier, the low-band first output matching circuit, and the low-band second output matching circuit are arranged to amplify a low-band RF input signal that is supplied to the low-band RF signal input terminal and to output a low-band RF amplified signal to the low-band RF signal output terminal;
the power amplifier further includes a control circuit that is arranged to receive a band select signal at a common terminal; and
the control circuit is arranged to control the high-band second output matching circuit and the low-band second output matching circuit in response to the band select signal that is received by the common terminal.

12. The power amplifier according to claim 11, wherein
the high-band first amplifier, the high-band second amplifier, the high-band first output matching circuit, and the high-band second output matching circuit are arranged to amplify the high-band RF input signal of a WCDMA system supplied to the high-band RF signal input terminal; and
the low-band first amplifier, the low-band second amplifier, the low-band first output matching circuit, and the low-band second output matching circuit are arranged to amplify the low-band RF input signal of the WCDMA system supplied to the low-band RF signal input terminal.

13. The power amplifier according to claim 12, wherein
the power amplifier further includes a GSM high-band RF signal input terminal, a GSM low-band RF signal input terminal, a GSM high-band RF signal output terminal, a GSM low-band RF signal output terminal, a GSM high-band amplifier, and a GSM low-band amplifier;
the GSM high-band amplifier is connected between the GSM high-band RF signal input terminal and the GSM high-band RF signal output terminal, and the GSM low-band amplifier is connected between the GSM low-band RF signal input terminal and the GSM low-band RF signal output terminal;
the control circuit is arranged to switch the GSM high-band amplifier and the GSM low-band amplifier between a GMSK operation of GSM system and an EDGE operation of the GSM system in response to a mode switch signal that is received by a first common terminal;
the control circuit is arranged to execute operations of ramp-up and ramp-down at a transmission slot of time division multiple access of the GSM system and an operation of amplitude modulation of EDGE system, of the GSM high-band amplifier and the GSM low-band amplifier, in response to a ramp voltage that is received by a second common terminal; and
the control circuit is arranged to control the high-band second output matching circuit and the low-band second output matching circuit in response to a plurality of band select signals that are received by the first common terminal and the second common terminal.

14. An operating method of a power amplifier including an RF signal input terminal, a first amplifier, a second amplifier, a first output matching circuit, a second output matching circuit, and an RF signal output terminal, wherein
the first amplifier includes a first transistor with a large element size to exhibit high power added efficiency in a high power state and a second transistor with a smaller element size than the element size of the first transistor to exhibit high power added efficiency in a low power state;

an input terminal of the first amplifier and an input terminal of the second amplifier are commonly connected to the RF signal input terminal, and an RF input signal that is supplied to the RF signal input terminal is amplified by the first amplifier and the second amplifier;

an output terminal of the first amplifier is connected to an input terminal of the first output matching circuit and an output terminal of the second amplifier is connected to an input terminal of the second output matching circuit;

an output terminal of the second output matching circuit is connected to the input terminal of the first output matching circuit and an output terminal of the first output matching circuit is connected to the RF signal output terminal;

an inductive reactance is connected between the output terminal of the second output matching circuit and the input terminal of the second output matching circuit, and a capacitive reactance is connected between the input terminal of the second output matching circuit and a ground voltage;

the RF input signal is amplified by the first amplifier if the power amplifier executes power amplification in the high power state, and a first RF amplified output signal of the first amplifier is output to the RF signal output terminal through the first output matching circuit;

the RF input signal is amplified by the second amplifier if the power amplifier executes power amplification in the low power state, and a second RF amplified output signal of the second amplifier is output to the RF signal output terminal through the second output matching circuit and the first output matching circuit;

the inductive reactance and the capacitive reactance of the second output matching circuit are set at respective predetermined values if the power amplifier executes the power amplification in the low power state and the RF input signal having a first frequency is amplified by the second amplifier, and at least one reactance of the inductive reactance and the capacitive reactance of the second output matching circuit is set at a larger value than the predetermined value if the power amplifier executes the power amplification in the low power state and the RF input signal having a second frequency that is lower than the first frequency is amplified by the second amplifier.

15. The operating method of the power amplifier according to claim 14, wherein the capacitive reactance is set at a predetermined capacitance value if the power amplifier executes the power amplification in the low power state and the RF input signal having the first frequency is amplified by the second amplifier; and the capacitive reactance is set at a larger capacitance value than the predetermined capacitance value if the power amplifier executes the power amplification in the low power state and the RF input signal having the second frequency is amplified by the second amplifier.

16. The operating method of the power amplifier according to claim 14, wherein the inductive reactance is set at a predetermined inductor value if the power amplifier executes the power amplification in the low power state and the RF input signal having the first frequency is amplified by the second amplifier; and the inductive reactance is set at a larger inductor value than the predetermined inductor value if the power amplifier executes the power amplification in the low power state and the RF input signal having the second frequency is amplified by the second amplifier.

17. The operating method of the power amplifier according to claim 14, wherein the second output matching circuit is supplied with a frequency band select signal;

the inductive reactance and the capacitive reactance of the second output matching circuit are set at the predetermined values if the frequency band select signal is in a first state; and the one reactance of the second output matching circuit is set at the larger value if the frequency band select signal is in a second state that is different from the first state.

18. The operating method of the power amplifier according to claim 17, wherein the second output matching circuit includes a first switch that is supplied with a mode select signal;

the first switch is controlled to be in one of an ON state and an OFF state if the mode select signal indicates the high power state such that an effect of the second output matching circuit to the output terminal of the first amplifier is reduced; and the first switch is controlled to be in the other of the ON state and the OFF state if the mode select signal indicates the low power state such that the second RF amplified output signal of the second amplifier is supplied to the input terminal of the first output matching circuit through the second output matching circuit including the first switch controlled to be in the other.

19. The operating method of the power amplifier according to claim 18, wherein the first amplifier is controlled to be in an active state and the second amplifier is controlled to be in a non-active state if the power amplifier executes the power amplification in the high power state; and the first amplifier is controlled to be in a non-active state and the second amplifier is controlled to be in an active state if the power amplifier executes the power amplification in the low power state.

20. The operating method of the power amplifier according to claim 19, wherein the one reactance includes a second switch that is supplied with the frequency band select signal;

the second switch is controlled to be in one of an ON state and an OFF state if the frequency band select signal is in the first state, and the second switch controlled to be in the one of the ON state and the OFF state sets the inductive reactance and the capacitive reactance of the second output matching circuit at the respective predetermined values; and the second switch is controlled to be in the other of the ON state and the OFF state if the frequency band select signal is in the second state, and the second switch controlled to be in the other of the ON state and the OFF state sets the one reactance of the second output matching circuit at the larger value.

* * * * *